US011101267B2

(12) United States Patent
Lim et al.

(10) Patent No.: US 11,101,267 B2
(45) Date of Patent: Aug. 24, 2021

(54) INTEGRATED CIRCUIT INCLUDING MULTIPLE-HEIGHT CELL AND METHOD OF MANUFACTURING THE INTEGRATED CIRCUIT

(71) Applicant: Samsung Electronics Co., Ltd., Suwon-si (KR)

(72) Inventors: Jin-young Lim, Seoul (KR); Jae-ho Park, Suwon-si (KR); Sang-hoon Baek, Seoul (KR); Hyeon-gyu You, Bongdong-eup (KR); Dal-hee Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 142 days.

(21) Appl. No.: 16/444,252

(22) Filed: Jun. 18, 2019

(65) Prior Publication Data

US 2020/0051977 A1    Feb. 13, 2020

(30) Foreign Application Priority Data

Aug. 10, 2018 (KR) .................. 10-2018-0093997

(51) Int. Cl.
| | |
|---|---|
| *H01L 27/088* | (2006.01) |
| *H01L 23/535* | (2006.01) |
| *H01L 29/06* | (2006.01) |
| *H01L 27/092* | (2006.01) |
| *H01L 27/02* | (2006.01) |
| *H01L 21/8234* | (2006.01) |
| *H02M 7/00* | (2006.01) |

(52) U.S. Cl.
CPC ........ *H01L 27/0886* (2013.01); *H01L 23/535* (2013.01); *H01L 29/0607* (2013.01)

(58) Field of Classification Search
CPC ............ H01L 29/0607; H01L 27/0924; H01L 27/0886; H01L 27/0207; H01L 23/535; G06F 30/398; G06F 30/392
See application file for complete search history.

(56) References Cited

U.S. PATENT DOCUMENTS

| | | | |
|---|---|---|---|
| 8,276,109 B2 | 9/2012 | Penzes | |
| 8,631,374 B2 | 1/2014 | Sherlekar | |
| 8,878,303 B2 | 11/2014 | Hatamian | |
| 8,975,712 B2 | 3/2015 | Rashed | |
| 9,483,600 B2 | 11/2016 | Bansal | |
| 9,786,645 B2 | 10/2017 | Yang | |
| 9,905,561 B2 | 2/2018 | Kim | |
| 2017/0062403 A1* | 3/2017 | Song | .............. G06F 30/398 |
| 2017/0236823 A1* | 8/2017 | Lee | .............. H03K 19/20 |
| | | | 257/369 |
| 2018/0097004 A1 | 4/2018 | Shimbo | |

* cited by examiner

*Primary Examiner* — Marcos D. Pizarro
*Assistant Examiner* — Antonio B Crite
(74) *Attorney, Agent, or Firm* — Myers Bigel, P.A

(57) ABSTRACT

Provided is an integrated circuit including: at least one active region extending in a first row in a first direction; at least one active region extending in a second row in the first direction; and a multiple height cell including the at least one active region in the first row, the at least one active region in the second row, at least one gate line extending in a second direction crossing the first direction, wherein each of the at least one active region in the first row and the at least one active region in the second row is terminated by a diffusion break.

20 Claims, 26 Drawing Sheets

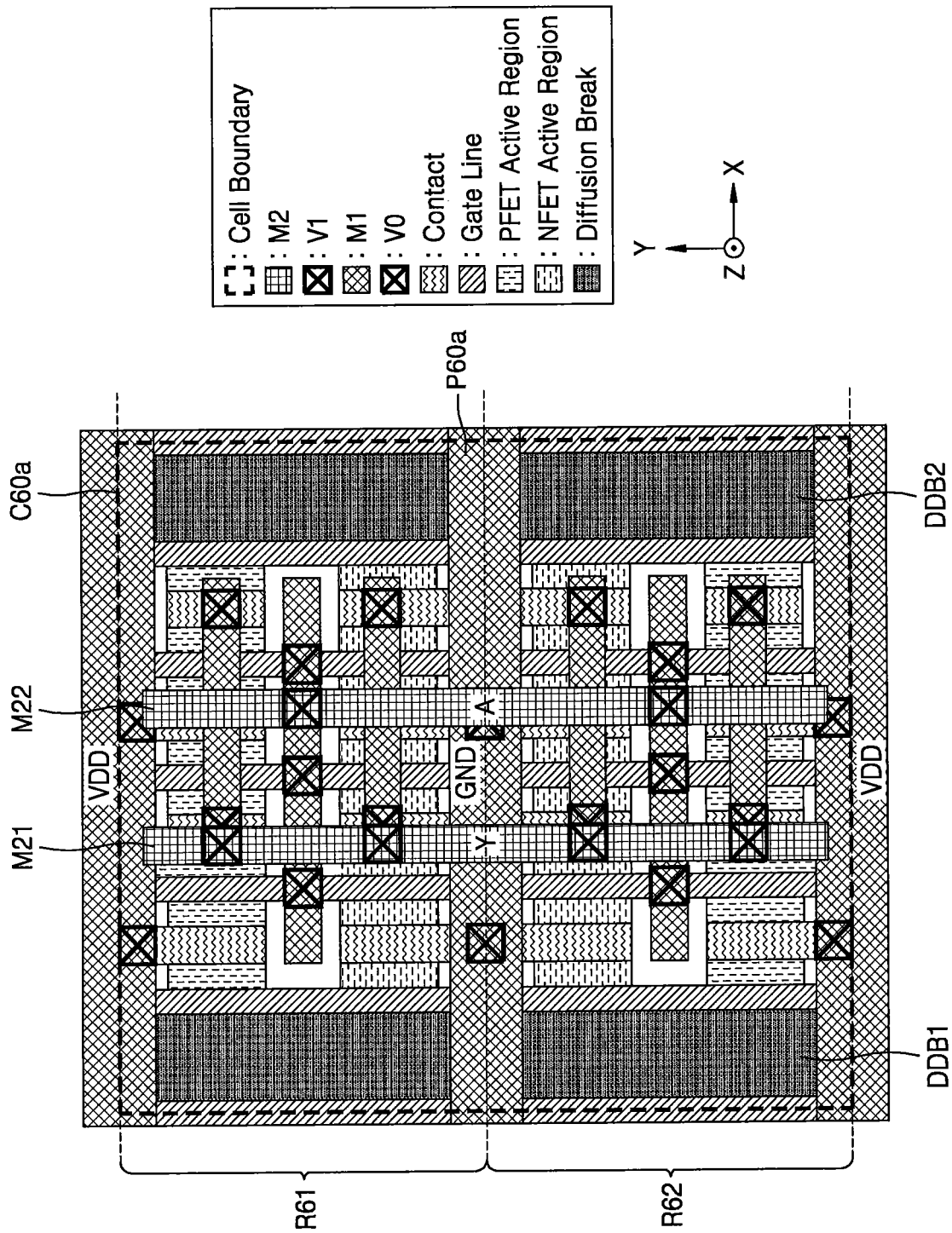

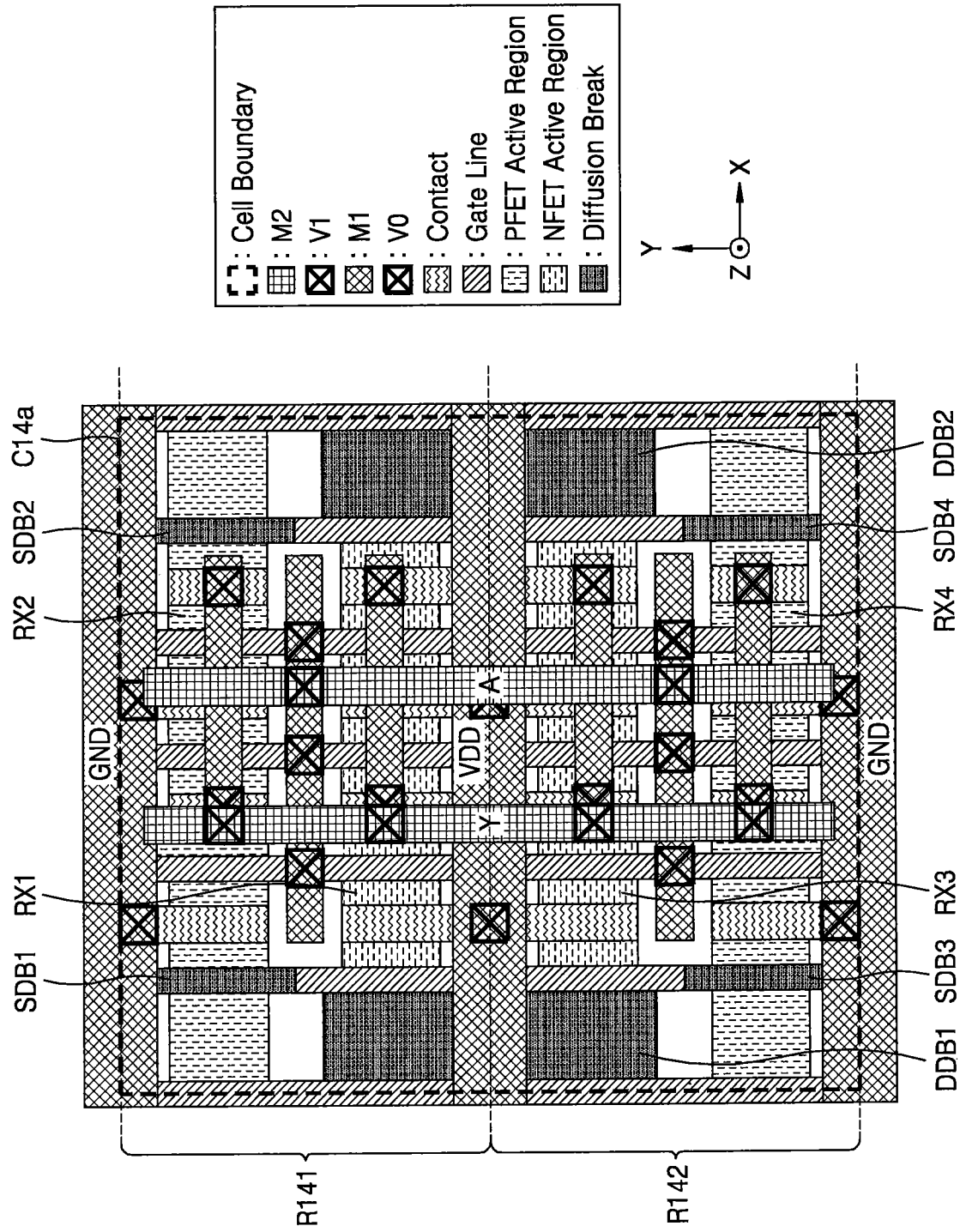

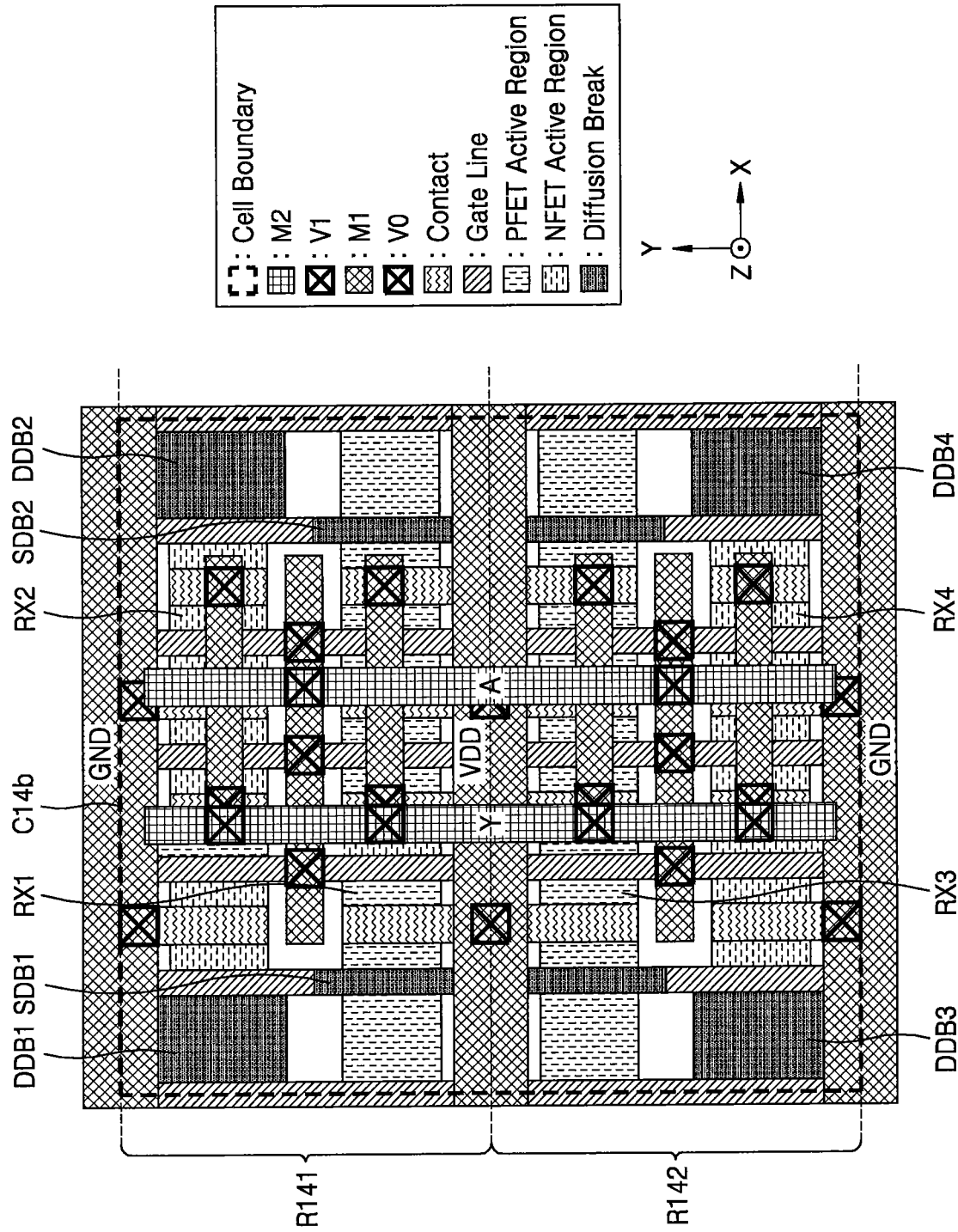

FIG. 16
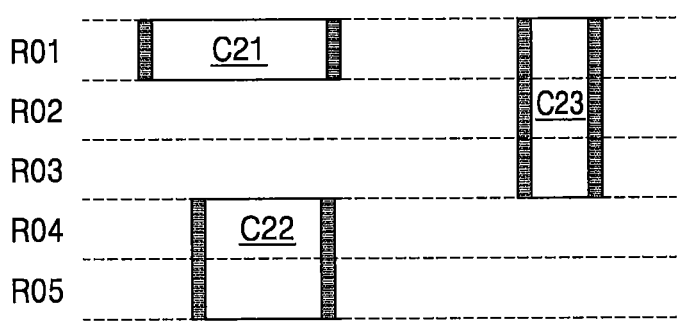
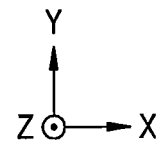

INTEGRATED CIRCUIT INCLUDING MULTIPLE-HEIGHT CELL AND METHOD OF MANUFACTURING THE INTEGRATED CIRCUIT

CROSS-REFERENCE TO RELATED APPLICATION

This application claims the benefit of and priority to Korean Patent Application No. 10-2018-0093997, filed on Aug. 10, 2018, in the Korean Intellectual Property Office, the disclosure of which is incorporated herein in its entirety by reference.

BACKGROUND

Embodiments of the inventive concept relate to an integrated circuit, and, more particularly, to an integrated circuit including a multiple height cell and methods of manufacturing the integrated circuit.

An integrated circuit may include a plurality of cells arranged in a plurality of rows. An integrated circuit may include cells providing a similar or an identical function, cells providing different functions, or cells providing similar/identical functions and different characteristics at the same time. For example, from among a plurality of cells providing a similar or identical function, those cells selected based on their characteristics, for example, operating speed, power consumption, area, or the like, may be included in an integrated circuit. In addition, an integrated circuit may include a single height cell placed in one row or a multiple height cell placed continuously in two or more rows.

SUMMARY

The inventive concept provides an integrated circuit including a plurality of cells, that is, multiple height cells having good characteristics and a method of manufacturing the integrated circuit.

According to an aspect of the inventive concept, there is provided an integrated circuit including: at least one active region extending in a first row in a first direction; at least one active region extending in a second row in the first direction; and a multiple height cell including: the at least one active region in the first row, the at least one active region in the second row, at least one gate line extending in a second direction crossing the first direction, wherein each of the at least one active region in the first row and the at least one active region in the second row is terminated by a diffusion break.

According to another aspect of the inventive concept, there is provided an integrated circuit including: a multiple height cell including a plurality of active regions in two or more rows extending in a first direction, wherein the multiple height cell includes: the plurality of active regions extending in the first direction and being terminated by a diffusion break; at least one gate line extending in a second direction crossing the first direction; and a plurality of transistor groups that are connected in parallel with each other and configured to commonly receive an input signal, wherein each of at least two transistor groups from among the plurality of transistor groups includes transistors that share one gate line.

According to another aspect of the inventive concept, there is provided an integrated circuit including: a multiple height cell including a plurality of active regions in two or more rows extending in a first direction, wherein the multiple height cell includes: the plurality of active regions extending in the first direction; and at least one gate line extending in a second direction crossing the first direction, wherein each of the plurality of active regions is terminated by a diffusion break.

BRIEF DESCRIPTION OF THE DRAWINGS

Embodiments of the inventive concept will be more clearly understood from the following detailed description taken in conjunction with the accompanying drawings in which:

FIGS. 6A and 6B are plan views illustrating inverter cells according to some embodiments of the inventive concept.

FIGS. 14A and 14B are plan views illustrating inverter cells according to some embodiments of the inventive concept;

FIG. 16 is a schematic plan view illustrating an integrated circuit according to some embodiments of the inventive concept;

Figure 1:
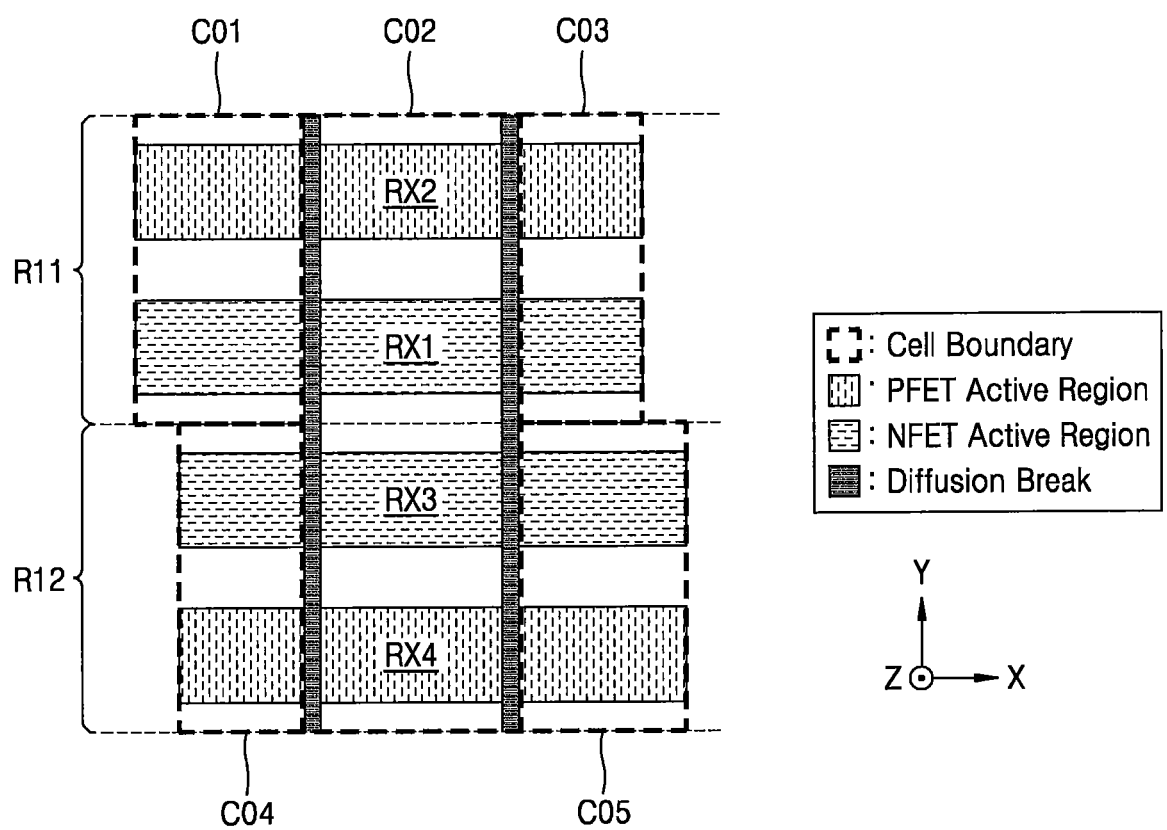
FIG. 1 is a schematic view illustrating a portion of an integrated circuit according to some embodiments of the inventive concept.

The drawings attached to the present specification may not be exact in scale or elements in the drawings may be exaggerated or contracted for convenience of illustration.

DETAILED DESCRIPTION OF THE EMBODIMENTS

The inventive concept will now be described more fully with reference to the accompanying drawings, in which example embodiments of the inventive concept are shown. Like reference numerals may refer to like elements throughout this application. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

To reduce a local layout effect (LLE) among cells in an integrated circuit, a diffusion break (DB) may be inserted into a boundary between cells. In addition to reducing the LLE between cells, the DB may also be advantageous for transistors that are positioned adjacent to the DB. Specifically, transistors adjacent the DB may provide a higher current than transistors that are farther away, which may improve operating speed. Some embodiments of the inventive concept may provide an improved integrated circuit including a multiple height cell with an increased number of transistors that are adjacent a DB. A multiple height cell may include active regions that are terminated by a single DB or a double DB based on conductivity type. For example, PFETS may have improved operating characteristics when adjacent to a single DB while NFETS may have improved operating characteristics when adjacent to a double DB.

FIG. 1 is a schematic view illustrating a portion of an integrated circuit 10 according to some embodiments of the inventive concept. In detail, FIG. 1 illustrates, on a plane, a layout of the integrated circuit 10 including a plurality of cells C01 through C05 placed in a first row R11 and a second row R12 along an X-axis and a Y-axis. In the present specification, an X-axis direction and a Y-axis direction may be referred to as a first horizontal direction and a second horizontal direction, respectively, and a Z-axis direction may be referred to as a vertical direction. A plane formed by an X-axis and a Y-axis may be referred to as a horizontal plane, and a component disposed relatively in a +Z direction compared to another component may be indicated as being above the other component, and a component disposed relatively in a −Z direction than another component may be indicated as being below the other component. Unless otherwise indicated in the present specification, a height of a component may refer to a length of the component in a Y-axis direction, and a width of a component may refer to a length of the component in an X-axis direction. In addition, an area of a component may refer to a size of the component on a plane that is parallel to a horizontal plane. In the drawings of the present specification, for convenience of illustration, only some layers may be illustrated, and vias may be illustrated to indicate connection between a pattern of a metal layer and a conductive pattern thereunder although the vias are located under the pattern of the metal layer.

A cell is a unit of a layout included in an integrated circuit, and may also be referred to as a standard cell. An integrated circuit may include a plurality of various cells. Cells may have a structure that complies with preset standards, and may be aligned and placed in a plurality of rows. For example, as illustrated in FIG. 1, a first cell C01 and a third cell C03 may be placed in the first row R11, and a fourth cell C04 and a fifth cell C05 may be placed in the second row R12. The first row R11 and the second row R12 may have equal or substantially equal heights, and the first cell C01 and the fourth cell C04 may have equal or substantially equal heights, that is, equal or substantially lengths in a Y-axis direction.

Referring to FIG. 1, a second cell C02 may be placed continuously in the first row R11 and the second row R12, i.e., the second cell C02 spans the first row R11 and the second row R12. Thus, the second cell C02 may have a length corresponding to a sum of heights of the two rows, that is, the first row R11 and the second row R12. As described above, a cell continuously placed in or spanning two or more consecutive rows may be referred to as a multiple height cell, and, particularly, a cell continuously placed in two adjacent rows may be referred to as a double height cell. A multiple height cell may have a height corresponding to a multiple of a height of a row (or a height of a single height cell), whereas a cell placed in one row, like the first cell C01, may be referred to as a single height cell.

The first through fifth cells C01 through C05 may include active regions extending in an X-axis direction as illustrated in FIG. 1. Although not illustrated in FIG. 1, in some embodiments, the first through fifth cells C01 through C05 may further include fins extending in an X-axis direction and a gate line extending in a Y-axis direction. In some embodiments, an active region may be formed in a substrate, and the substrate may include a semiconductor, such as Si or Ge, a compound semiconductor, such as SiGe, SiC, GaAs, InAs or InP, or a conductive region, such as an impurity-doped well or an impurity-doped structure. In some embodiments, the gate line may include a work function metal-containing layer and a gap fill metal film. For example, the work function metal-containing layer may include one or more metals including, but not limited to, Ti, W, Ru, Nb, Mo, Hf, Ni, Co, Pt, Yb, Tb, Dy, Er, and Pd, and the gap fill metal film may be formed of a W film and/or an Al film. In some embodiments, the gate line may include a stacked structure of TiAlC/TiN/W, a stacked structure of TiN/TaN/TiAlC/TiN/W, or a stacked structure of TiN/TaN/TiN/TiAlC/TiN/W. In the following drawings, fins on an active region may not be illustrated for convenience of illustration, but it will be understood that embodiments of the inventive concept are applicable not only to cells that include planar transistors, but also to cells that include a fin field effect transistor (FinFET). In addition, in some embodiments, an active region may include at least a portion of a fin structure, and, in this case, a fin may be referred to as a fin-type active region. In addition, in some embodiments, a fin may be referred to as including source/drain regions formed on two sides of a gate line.

The second cell C02 as a multiple height cell may include first and second active regions RX1 and RX2 extending in the first row R11 in an X-axis direction and third and fourth active regions RX3 and RX4 extending in the second row R12 in an X-axis direction, and the first active region RX1 and the third active region RX3 may be adjacent to each other. Although not illustrated in FIG. 1, the integrated circuit 10 may include a plurality of power lines extending at boundaries of cells in an X-axis direction to supply power to the cells. In some embodiments, a positive supply voltage may be applied to odd-numbered power lines from among a plurality of power lines, whereas a ground voltage (or a negative supply voltage) may be applied to even-numbered power lines. In some embodiments, supply voltages may be applied to a plurality of power lines in an opposite manner to the above description. Accordingly, as illustrated in FIG. 1, a pair of active regions of a same conductivity type, that is, a pair of active regions for an N-channel field effect transistor (NFET) or a pair of active regions for a P-channel field effect transistor (PFET) may be disposed adjacent to each other in a Y-axis direction. For example, a power line, to which a ground voltage is applied, may extend on a boundary between the first row R11 and the second row R12 in an X-axis direction, and the first active region RX1 and the third active region RX3 that are adjacent to that power line may be active regions for an NFET, whereas the second active region RX2 and the fourth active region RX4 may be active regions for a PFET.

In some embodiments, the first through fourth active regions RX1 through RX4 of the second cell C02 may be terminated by a diffusion break. A diffusion break may be inserted to reduce an effect, for example, a local layout effect (LLE), between adjacent cells. A diffusion break may separate diffusion regions between adjacent cells and may be filled with or contain an insulator. In some embodiments, a diffusion break may separate fins among adjacent cells. In some embodiments, a diffusion break may separate a diffusion region among adjacent cells by removing a diffusion region and/or at least a portion of the diffusion region. Examples of the diffusion break will be described later with reference to FIG. 2. In addition, as will be described later with reference to FIG. 3, a diffusion break may provide an LLE that is advantageous to an adjacent transistor, and the closer to a diffusion break a transistor is, the better its characteristics may be, and the second cell C02 may include more transistors than a single height cell that performs a same function as the second cell C02 (or that corresponds to a circuit similar or identical to that of the second cell C02), wherein the transistors are adjacent to the diffusion break. Accordingly, the second cell C02 may provide better characteristics than a single height cell, and, thus, the integrated circuit 10 may have improved performance.

In some embodiments, the second cell C02 may include two or more transistors having a similar or same function and may have a relatively high driving strength or capability. For example, as will be described below with reference to FIGS. 4A and 4B, for a high-speed inverting operation, an inverter cell may include six PFETs that are connected in parallel with each other and six NFETs that are connected in parallel with each other. When a high driving strength cell is implemented as a single height cell, and the number of transistors is increased to enhance driving strength, the number of transistors that are apart from a diffusion break may be increased. Conversely, when a high driving strength cell is implemented as a double height cell, such as or similar to the second cell C02 of FIG. 1, or as a multiple height cell where cells span or are continuously placed in three or more rows, the number of transistors adjacent to a diffusion break may be increased.

Although FIG. 1 illustrates that diffusion breaks are included in the second cell C02, in some embodiments, diffusion breaks may be present outside the second cell C02, and the second cell C02 may be regarded as sharing the diffusion breaks with adjacent cells, that is, the first cell C01, the third cell C03, the fourth cell C04, and the fifth cell C05. In addition, while the diffusion breaks are illustrated as having a length in a Y-axis direction like the second cell C02 in FIG. 1, in some embodiments, diffusion breaks may also have a shorter length in a Y-axis direction than the second cell C02, and in some embodiments, the diffusion breaks may be discontinuously separated as portions respectively corresponding to the first through fourth active regions RX01 through RX04.

Figure 2:
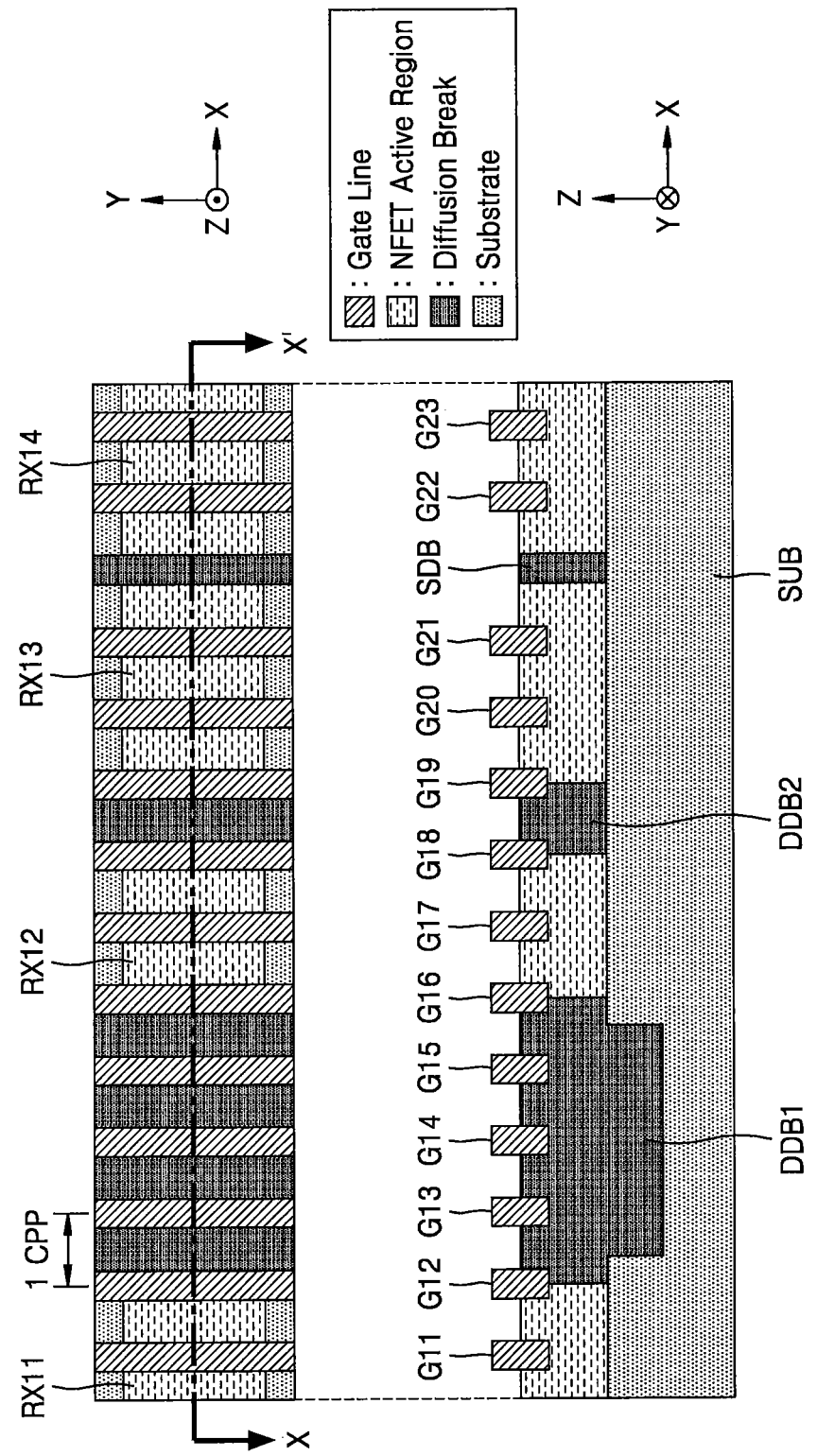
FIG. 2 illustrates examples of diffusion breaks according to some embodiments of the inventive concept.

FIG. 2 illustrates examples of diffusion breaks according to some embodiments of the inventive concept. In detail, an upper portion of FIG. 2 is a plan view of a layout including diffusion breaks, and a lower portion of FIG. 2 is a cross-sectional view of the diffusion breaks taken along line X-X' in the upper portion of FIG. 2. For convenience of illustration, source/drain regions on two sides of a gate line in FIG. 2 are not distinguished in FIG. 2.

Referring to FIG. 2, first through fourth active regions RX11 through RX14 may be disposed on a substrate SUB, and a plurality of gate lines G11 through G23 may extend in parallel to each other in a Y-axis direction on the first through fourth active regions RX11 through RX14. A pitch between the plurality of gate lines G11 through G23 may be referred to as a 1 contacted poly pitch (1 CPP). The first through fourth active regions RX11 through RX14 may be separated from each other via diffusion breaks. For example, the first active region RX11 and the second active region RX12 may be separated via a first double diffusion break DDB1, and the second active region RX12 and the third active region RX13 may be separated via a second double diffusion break DDB2, and the third active region RX13 and the fourth active region RX14 may be separated via a single diffusion break SDB.

A double diffusion break DDB may have a width of about 1 CPP or more, that is, a length in an X-axis direction. A double diffusion break may be formed by etching an active region, such as the second double diffusion break DDB2, or such as the first double diffusion break DDB1, by further etching a portion of the substrate in addition to the active region. A gate line on a double diffusion break may be referred to as a dummy gate line where an active region and a transistor may not be formed, and in some embodiments, the gate line may be used as a conductive path. For example, the gate lines G12 through G16 on the first double diffusion break DDB1 may be dummy gate lines where no transistor may be formed, and gate lines G18 and G19 on the second double diffusion break DDB2 may also be dummy gate lines where no transistor may be formed. The single diffusion break SDB may have a width that is approximately equal to a width of a gate line, that is, a length in an X-axis direction. As illustrated in FIG. 2, no gate line may be formed on the single diffusion break SDB. Hereinafter, description of embodiments of the inventive concept will focus on the second double diffusion break DDB2 and the single diffusion break SDB that have a width of about 1 CPP like the second double diffusion break DDB2.

Figure 3:
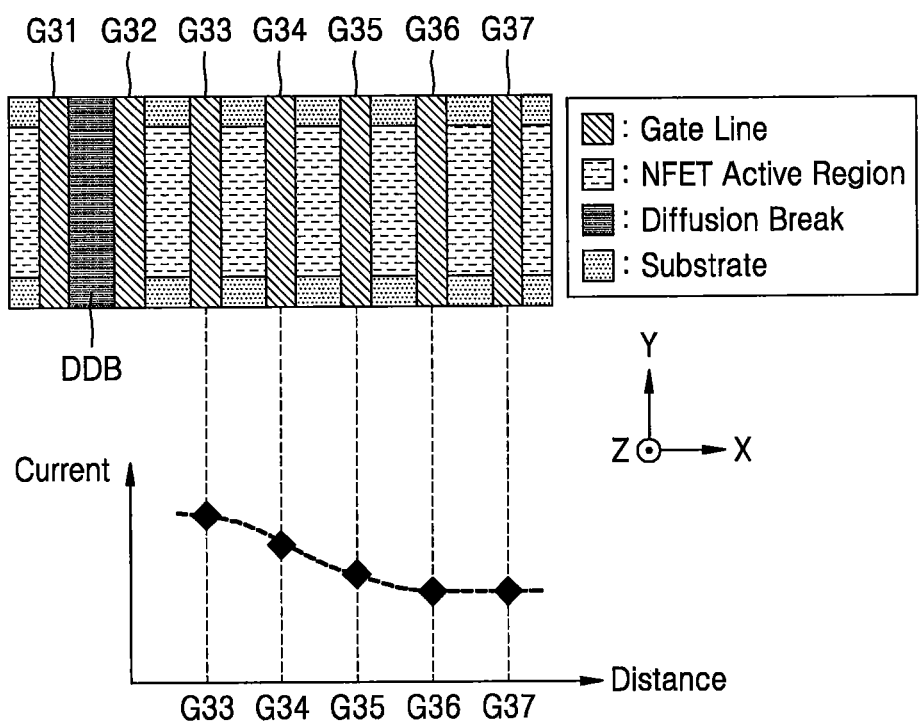
FIG. 3 illustrates a relationship between a diffusion break and an element according to some embodiments of the inventive concept.

FIG. 3 illustrates a relationship between a diffusion break and an element according to some embodiments of the inventive concept. In detail, an upper portion of FIG. 3 is a plan view of a layout including a double diffusion break DDB, and a lower portion of FIG. 3 shows a relationship between a distance of an element from the double diffusion break DDB and a current of the element.

Referring to the upper portion of FIG. 3, first and second gate lines G31 and G32 on the double diffusion break DDB may be dummy gate lines, and third through seventh gate lines G33 through G37 may respectively form an active region and an NFET. Referring to the lower portion of FIG. 3, the closer to a double diffusion break DDB a device, such as an NFET, is, the higher the current the device may provide, whereas the farther from the double diffusion break DDB a device, such as an NFET, is, the lower the current the device may provide. In other words, a device may provide increasing current with increasing proximity to a DDB and decreasing current with increasing distance from a DDB in accordance with some embodiments of the inventive concept. For example, an NFET formed via the third gate line G33 that is closest to the double diffusion break DDB may provide a higher current than an NFET formed via the sixth gate line G36. A device providing a relatively high current may have a relatively high operating speed, and, accordingly, the greater the number of transistors adjacent to the double diffusion break DDB, the lower may be an operating speed of a cell including the transistors, for example, a response time of an output signal with respect to an input signal. Although FIG. 3 illustrates an example of the double diffusion break DDB, a single diffusion break may provide similar operating characteristics as the DDB, that is, a device that is relatively close to the single diffusion break may provide a relatively high current and have a relatively high operating speed in a similar manner to the embodiment of FIG. 3.

Figure 4A:
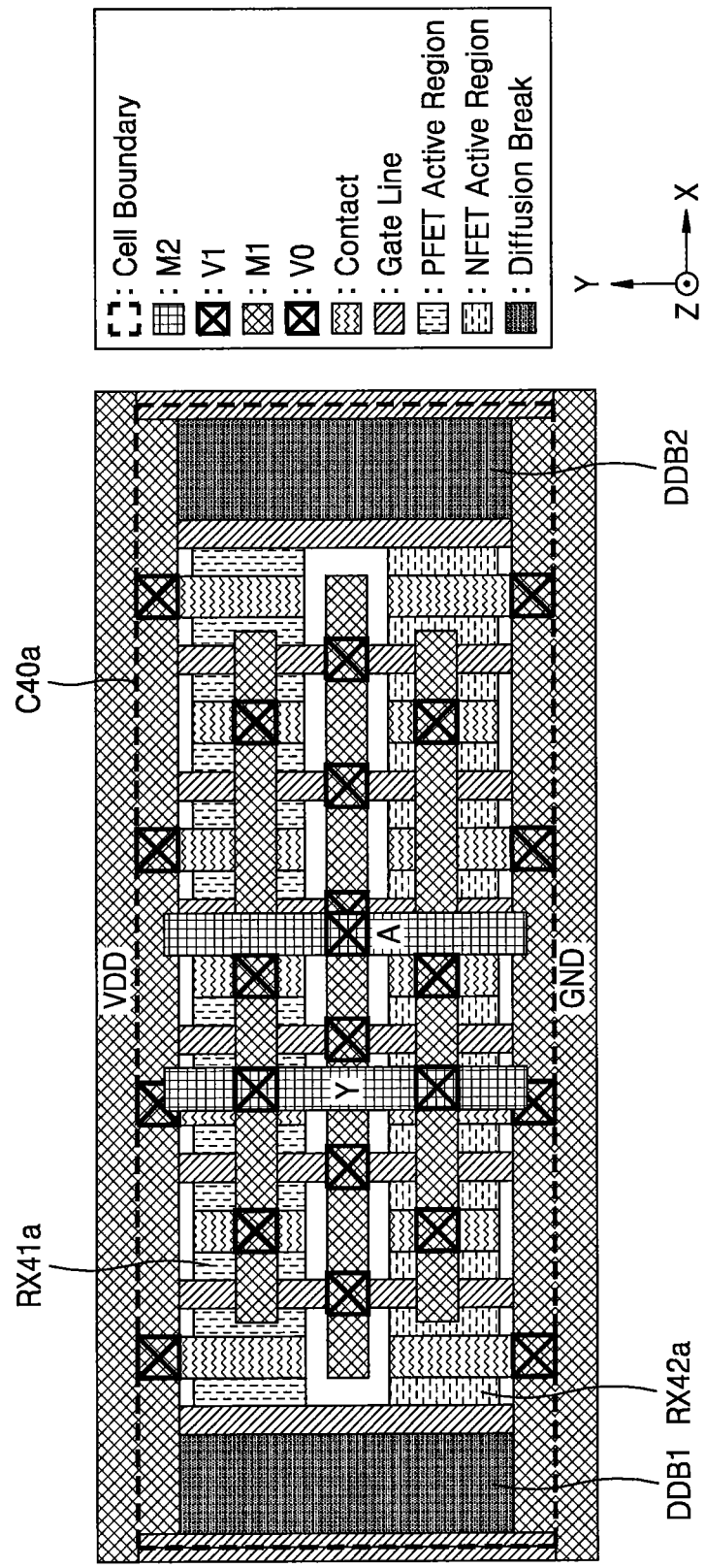
FIGS. 4A and 4B are plan views illustrating inverter cells according to embodiments of the inventive concept.
Figure 4B:
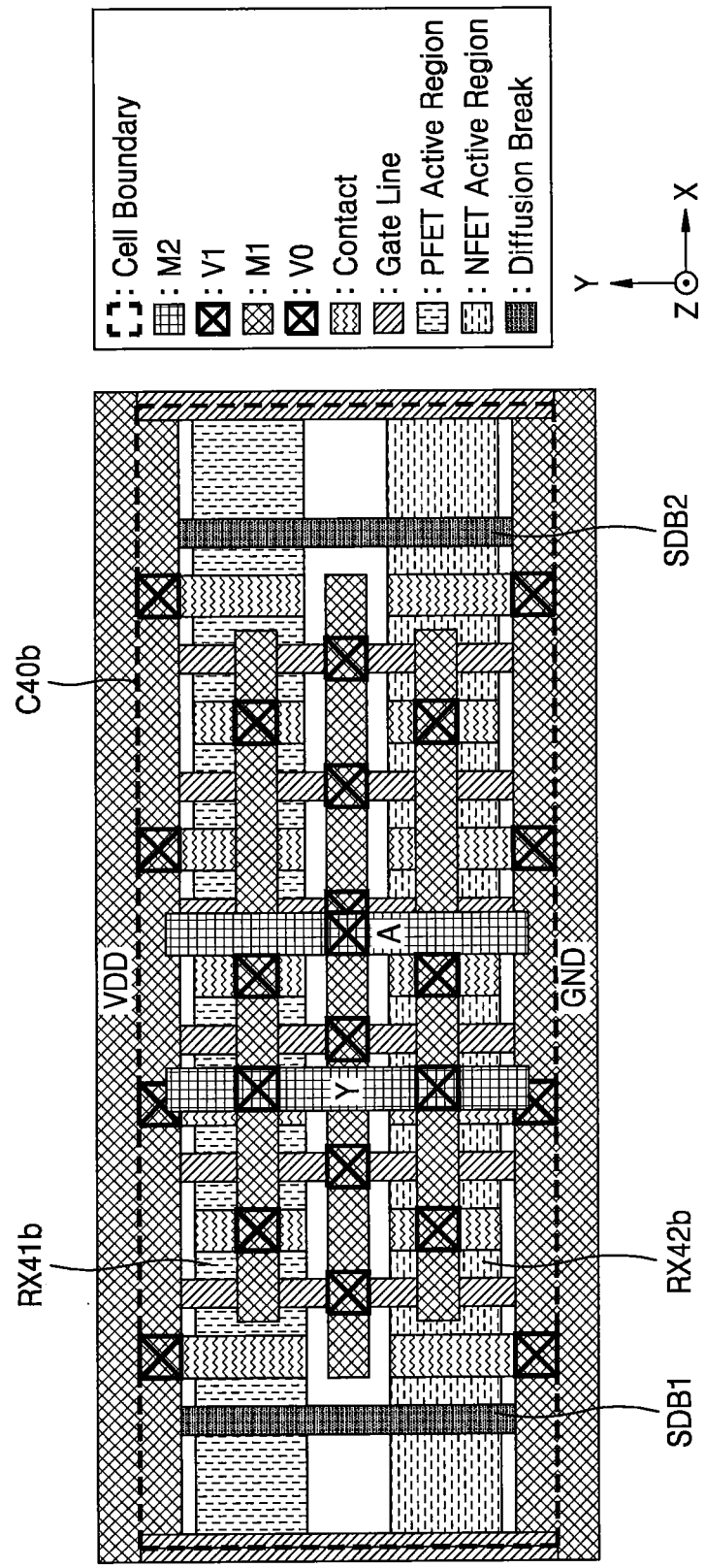
Figure 5:
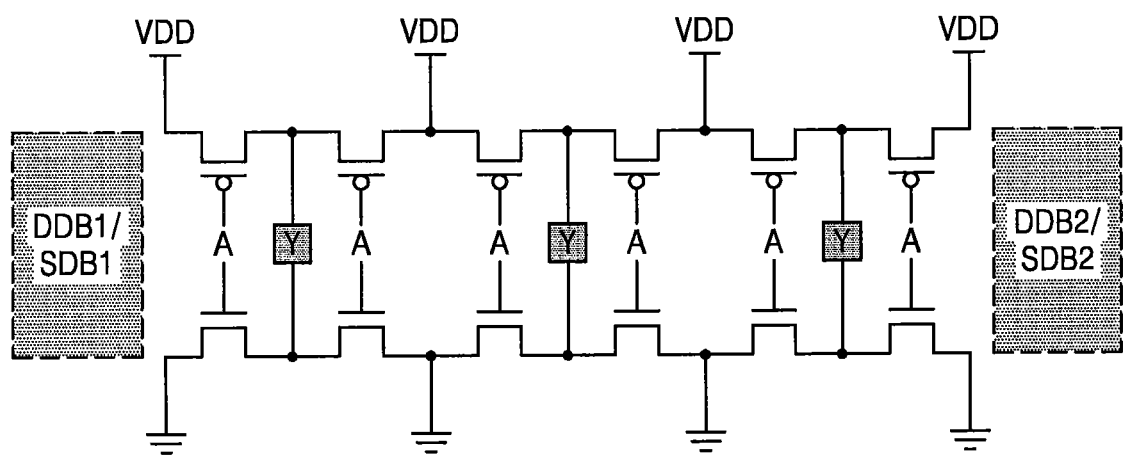
FIG. 5 is a circuit diagram corresponding to the inverter cells of FIGS. 4A and 4B according to some embodiments of the inventive concept.

FIGS. 4A and 4B are plan views illustrating inverter cells C40a and C40b according to some embodiments of the inventive concept, and FIG. 5 is a circuit diagram corresponding to the inverter cells C40a and C40b of FIGS. 4A and 4B according to some embodiments of the inventive concept. In detail, FIGS. 4A and 4B respectively illustrate layouts of the inverter cells C40a and C40b, which are single height cells and include six transistors that are connected in parallel with each other.

Referring to FIG. 4A, the inverter cell C40a may include a first active region RX41a and a second active region RX42a extending in an X-axis direction, and the first active region RX41a and the second active region RX42a may each be terminated by double diffusion breaks DDB1 and DDB2. Accordingly, as illustrated in FIG. 5, two PFETs and two NFETs of an inverter cell C40 may be disposed adjacent to the double diffusion breaks DDB1 or DDB2.

Similarly, referring to FIG. 4B, the inverter cell C40b may include a first active region RX41b and a second active region RX42b extending in an X-axis direction, and the first active region RX41b and the second active region RX42b may each be terminated by single diffusion breaks SDB1 and SDB2. Accordingly, as illustrated in FIG. 5, two PFETs and two NFETs of the inverter cell C40 may be disposed adjacent to the single diffusion breaks SDB1 or SDB2.

Figure 6B:
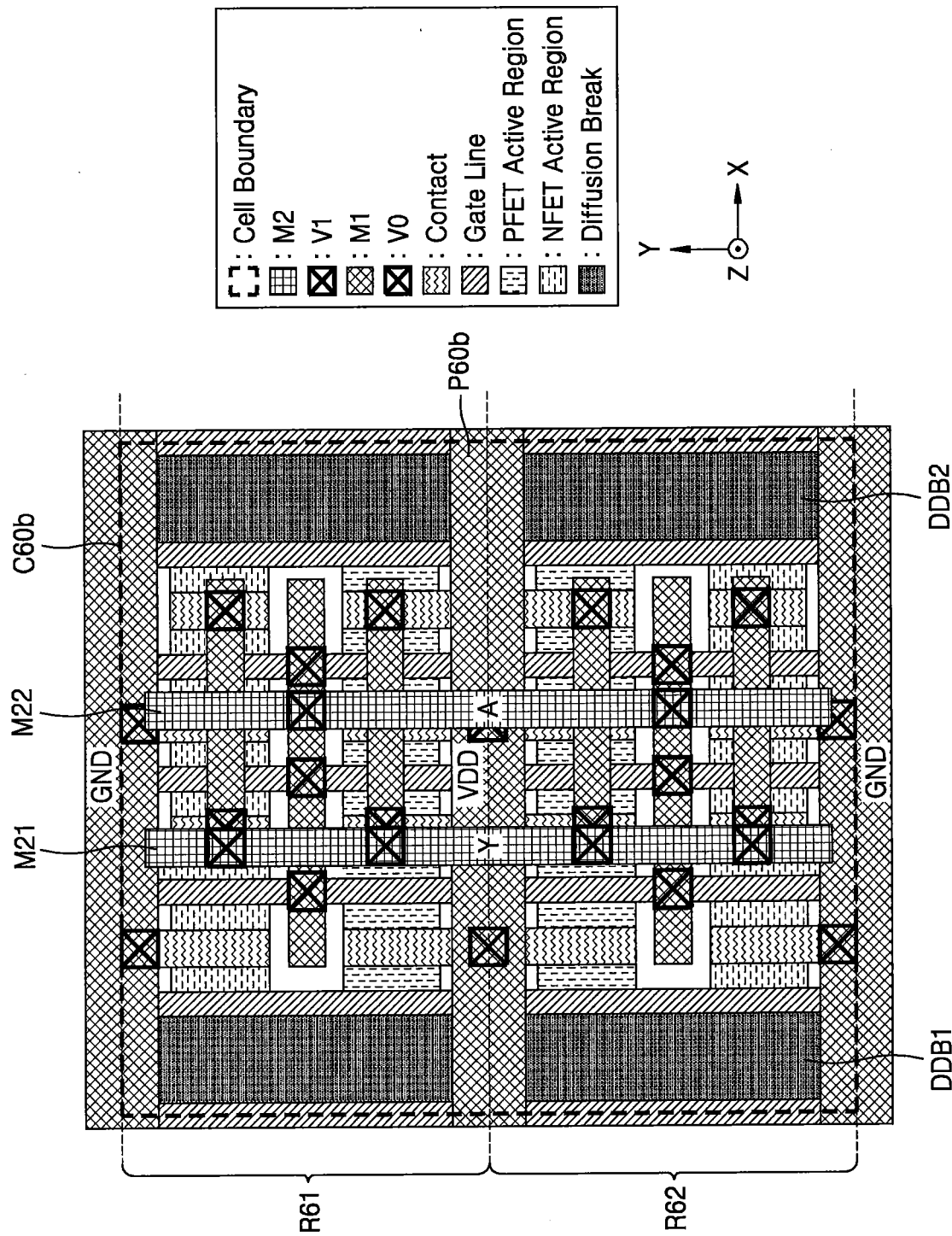
Figure 7A:
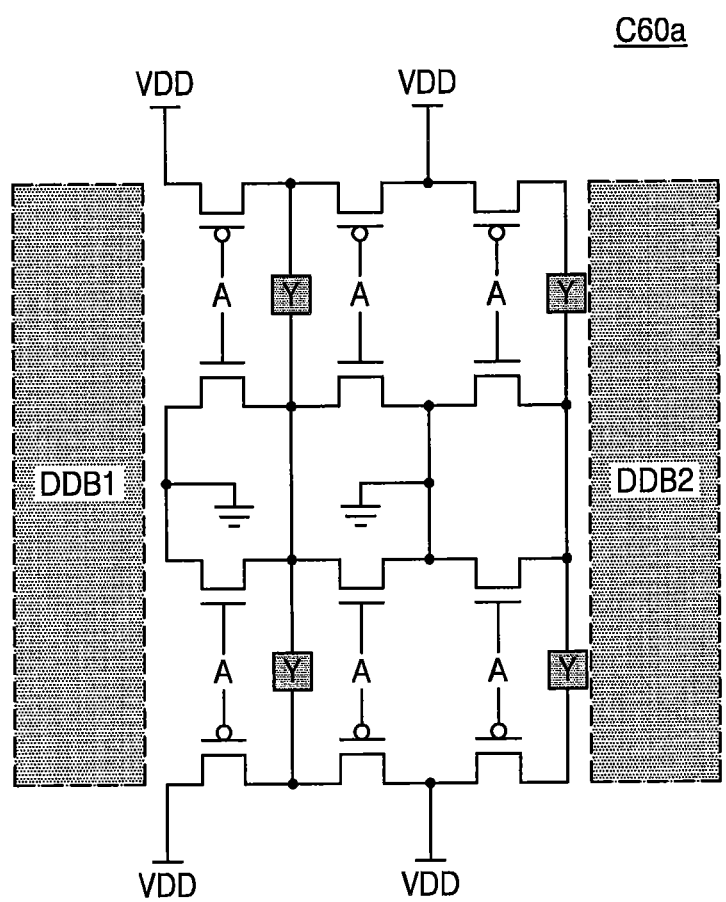
FIGS. 7A and 7B are circuit diagrams corresponding to the inverter cells of FIGS. 6A and 6B according to some embodiments of the inventive concept.
Figure 7B:
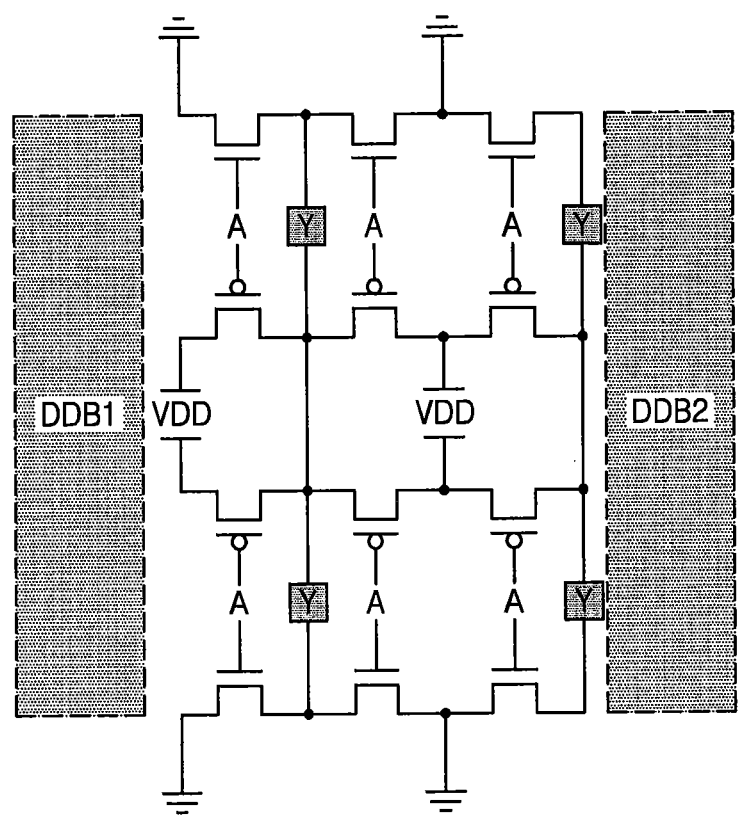

FIGS. 6A and 6B are plan views illustrating inverter cells C60a and C60b according to embodiments of the inventive concept, and FIGS. 7A and 7B are circuit diagrams corresponding to the inverter cells C60a and C60b of FIGS. 6A and 6B according to some embodiments of the inventive concept. In detail, FIGS. 6A and 6B respectively illustrate layouts of the inverter cells C60a and C60b, which are double height cells and include six transistors that are connected in parallel with each other.

Referring to FIG. 6A, the inverter cell C60a may be placed in a first row R61 and a second row R62, and a power line P60a to which a ground voltage GND is applied may extend in an X-axis direction at a boundary between the first row R61 and the second row R62. Accordingly, the inverter cell C60a may include active regions for an NFET adjacent to the power line P60a. In addition, each of a plurality of active regions included in the inverter cell C60a may be terminated by the double diffusion breaks DDB1 and DDB2. Accordingly, as illustrated in FIG. 7A, four PFETs and four NFETs may be disposed adjacent to the double diffusion breaks DDB1 or DDB2 in the inverter cell C60a.

As illustrated in FIG. 6A, the inverter cell C60a may include a first pattern M21 in a layer M2 to electrically connect patterns of a layer M1 corresponding to an output signal Y, and may include a second pattern M22 of a layer M2 to electrically connect patterns of the layer M1 corresponding to an input signal A. The first pattern M21 and the second pattern M22 may pass through the boundary between the first row R61 and the second row R62 to extend in a Y-axis direction as illustrated in FIG. 6A. In addition, the first pattern M21 may function as an output pin of the inverter cell C60a, and the second pattern M22 may function as an input pin of the inverter cell C60a. That is, the first pattern M21 and the second pattern M22 may be used to perform signal routing and may also function as a pin of cells, and accordingly, the inverter cell C60a may have a relatively simple wiring structure.

The inverter cell C60a may provide improved routability compared to the inverter cell C40a of FIG. 4A. As will be described below with reference to FIG. 17, after cells are placed, a routing operation to electrically connect input pins and/or output pins of cells may be performed. For example, after the inverter cell C60a of FIG. 6A is placed, patterns of a layer M3 above the layer M2 may be disposed to rout an input pin of the layer M2 corresponding to an input signal A and an output pin of the layer M2 corresponding to the output signal Y. While the layer M2 may include patterns extending in a Y-axis direction, the layer M3 may include patterns extending in an X-axis direction. Accordingly, due to extended lengths of the first pattern M21 and the second pattern M22 of FIG. 6A in the Y-axis direction, the first pattern M21 and the second pattern M22 of FIG. 6A may provide more points where vias to be connected to the patterns of the layer M3 may be disposed, that is, there may be more candidate via points in the inverter cell C60a of FIG. 6A than in the inverter cell C40a of FIG. 4A. Accordingly, the inverter cell C60a of FIG. 6A may provide improved routability, and routing congestion in an integrated circuit including the inverter cell C60a may be reduced.

Referring to FIG. 6B, the inverter cell C60b may be placed in the first row R61 and the second row R62, and a power line P60b to which a supply voltage VDD is applied may extend in an X-axis direction at a boundary between the first row R61 and the second row R62. Accordingly, the inverter cell C60b may include active regions for a PFET adjacent to the power line P60b. In addition, each of a plurality of active regions included in the inverter cell C60b may be terminated by the double diffusion breaks DDB1 and DDB2. Accordingly, as illustrated in FIG. 7B, four PFETs and four NFETs may be disposed adjacent to the double diffusion break DDB1 or DDB2 in the inverter cell C60b.

Like the inverter cell C60a of FIG. 6A and the inverter cell C60b of FIG. 6B, two different cells respectively having different layouts providing a same or similar function and same or similar characteristics according to a voltage applied to a power line may be provided. As will be described below with reference to FIG. 17, a cell library D72 of FIG. 17 may define two different cells, and one of the two different cells may be selected and placed based on a voltage of a power line during a placement and routing process. In addition, it will be understood that, although FIGS. 6A and 6B illustrate the inverter cells C60a and C60b including active regions terminated by the double diffusion breaks, inverter cells including active regions terminated by single diffusion breaks may also be included as double height cells according to some embodiments of the inventive concept.

Figure 8A:
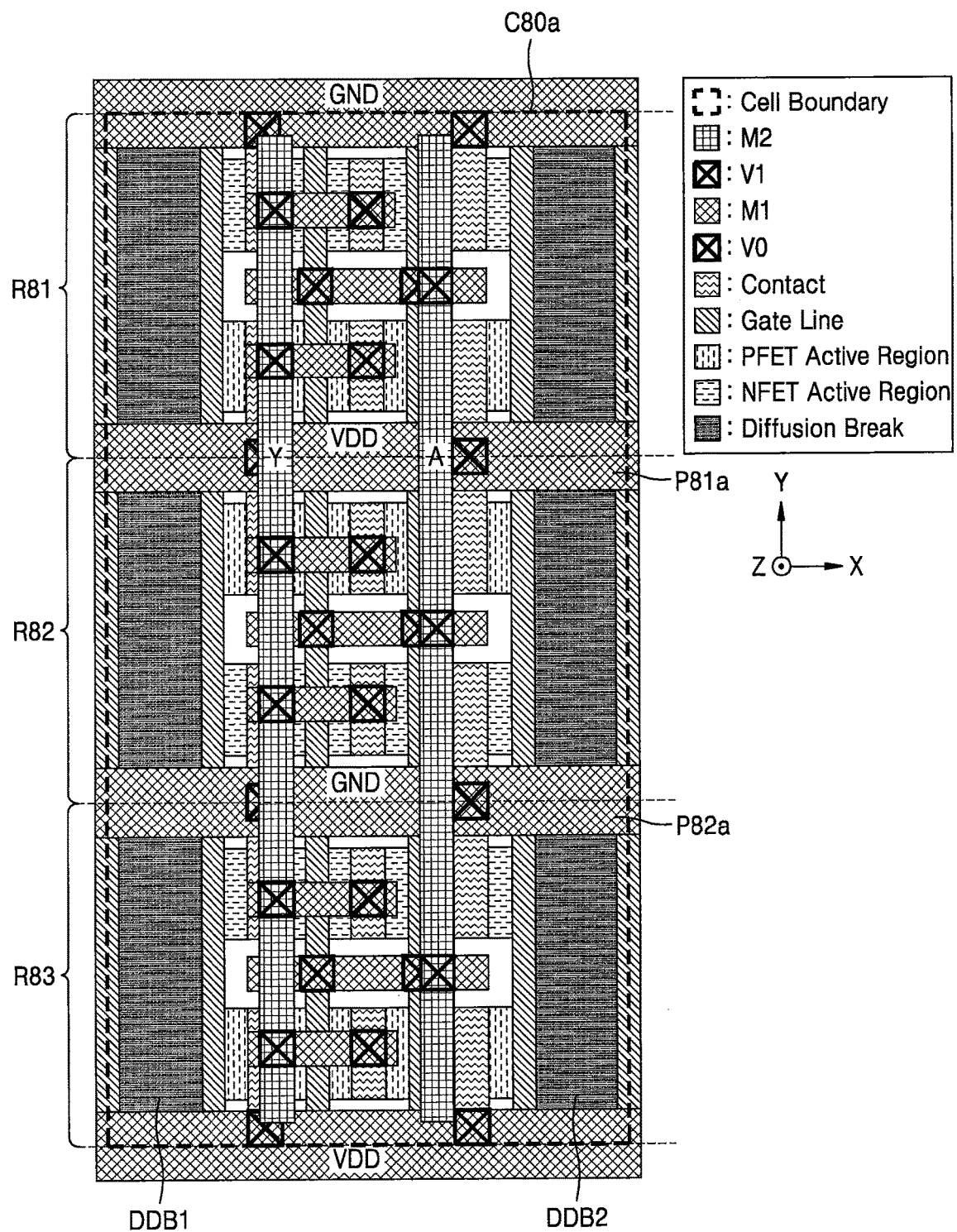
FIGS. 8A and 8B are plan views illustrating inverter cells according to some embodiments of the inventive concept.
Figure 8B:
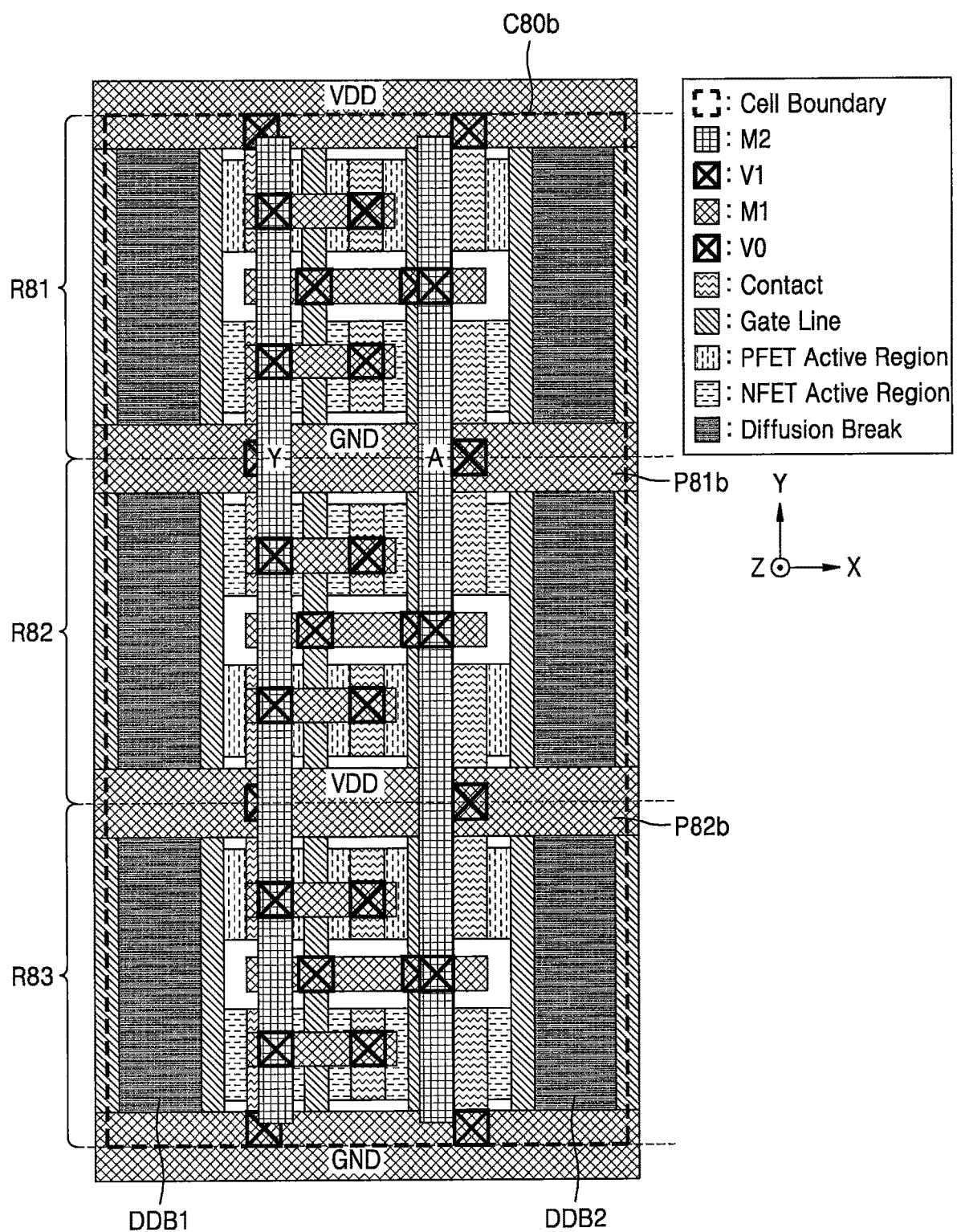

FIGS. 8A and 8B are plan views illustrating inverter cells C80a and C80b according to some embodiments of the inventive concept. In detail, FIGS. 8A and 8B respectively illustrate inverter cells C80a and C80b that are multiple height cells continuously placed in or spanning first through third rows R81, R82, and R83 and include six transistors connected in parallel to each other, like the inverter cells C40a and C40b of FIGS. 4A and 4B and the inverter cells C60a and C60b of FIGS. 6A and 6B. Hereinafter, the description of elements or features provided above with reference to FIGS. 6A and 6B will be omitted in the description of the embodiments of FIGS. 8A and 8B in the interest of brevity.

Referring to FIG. 8A, the inverter cell C80a may be placed in or may span the first row R81, the second row R82, and the third row R83, and a first power line P81a to which a positive supply voltage VDD is applied may extend in an X-axis direction at a boundary between the first row R81 and the second row R82, and a second power line P82a to which a ground voltage GND is applied may extend in an X-axis direction at a boundary between the second row R82 and the third row R83. Accordingly, the inverter cell C80a may include active regions for a PFET adjacent to the first power line P81a and active regions for an NFET adjacent to the second power line P82a. In addition, each of a plurality of active regions included in the inverter cell C80a may be terminated by the double diffusion breaks DDB1 and DDB2. Accordingly, six PFETs and six NFETs may be disposed adjacent to the double diffusion break DDB1 or DDB2 in the inverter cell C80a.

Referring to FIG. 8B, the inverter cell C80b may be placed in or may span the first row R81, the second row R82, and the third row R83, and a first power line P81b to which a ground voltage GND is applied may extend in an X-axis direction at a boundary between the first row R81 and the second row R82, and a second power line P82b to which a positive supply voltage VDD is applied may extend in an X-axis direction at a boundary between the second row R82 and the third row R83. Accordingly, the inverter cell C80b may include active regions for an NFET adjacent to the first power line P81b and active regions for a PFET adjacent to the second power line P82b. In addition, each of a plurality of active regions included in the inverter cell C80b may be terminated by the double diffusion breaks DDB1 and DDB2. Accordingly, six PFETs and six NFETs may be disposed adjacent to the double diffusion break DDB1 or DDB2 in the inverter cell C80b.

As described above with reference to FIGS. 4A through 8B, cells corresponding to an identical circuit may have different layouts, and the higher the number of transistors adjacent to a diffusion break, the more area the cells take up and the higher the performance that may be provided. For example, the inverter cell C60a of FIG. 6A, which is a double height cell, has a larger area than the inverter cell C40a of FIG. 4A which is a single height cell. Due to an extended area of a double diffusion break, and also, due to an increased number of transistors adjacent to the double diffusion break, the inverter cell C60a may provide higher performance than the inverter cell C40a of FIG. 4A. In addition, the inverter cell C80a of FIG. 8A, which is a multiple height cell continuously placed or spanning over three rows, has a larger area than the inverter cell C60a of FIG. 6A, which is a double height cell. Due to an extended area of the double diffusion break, and also, due to an increased number of transistors adjacent to the double diffusion break, the inverter cell C80a may provide higher performance than the inverter cell C60a of FIG. 6A. Accordingly, the inverter cell C40a of FIG. 4A may be used in a portion of an integrated circuit where a high integration degree is required (for example, the integrated circuit 10 of FIG. 1), and the inverter cell C80a of FIG. 8A may be used in a portion of an integrated circuit requiring high performance, and the inverter cell C60a of FIG. 6A may be used in a portion of an integrated circuit requiring both a high integration degree and high performance in a balanced manner.

Figure 9A:
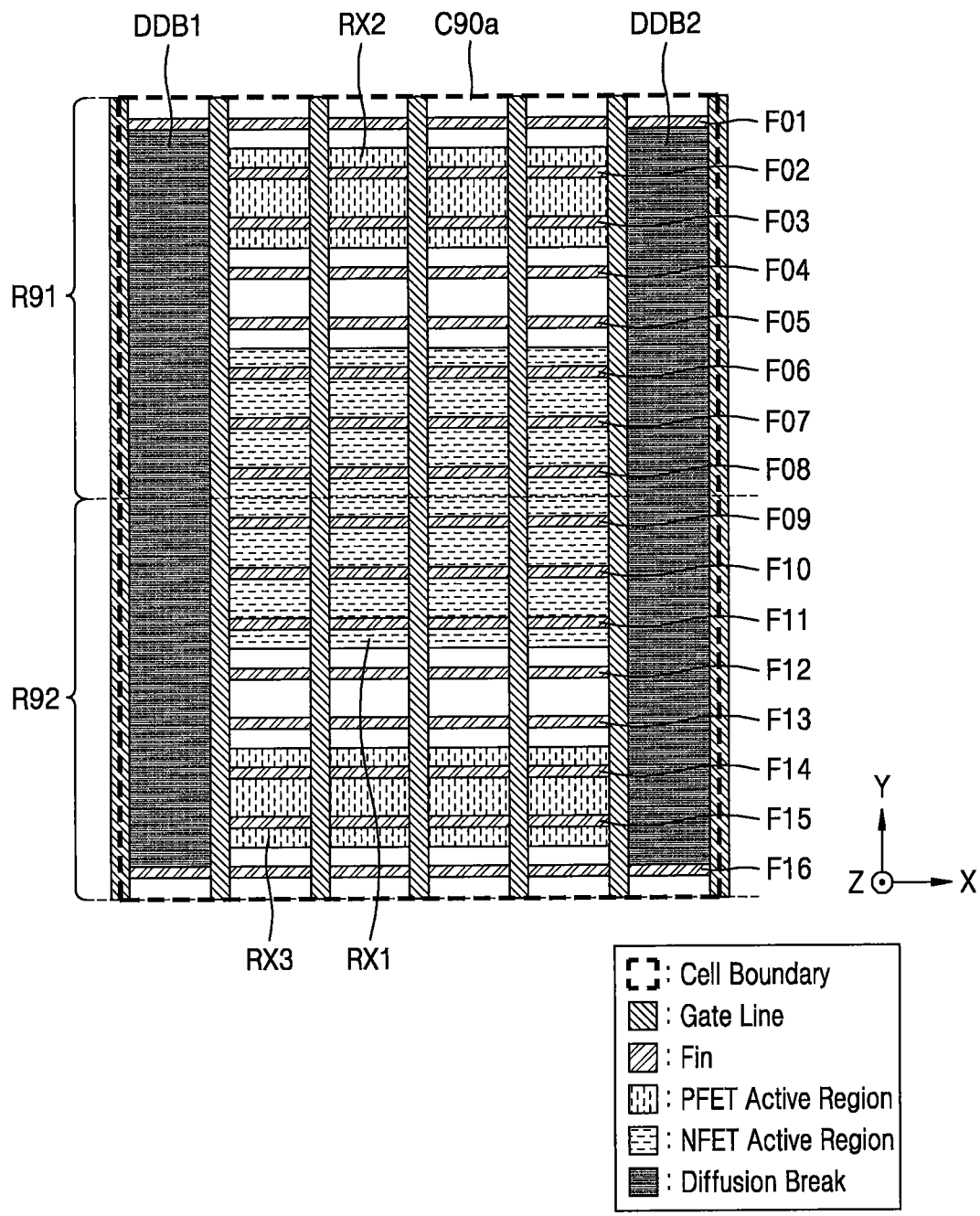
FIGS. 9A and 9B are plan views illustrating cells according to some embodiments of the inventive concept.
Figure 9B:
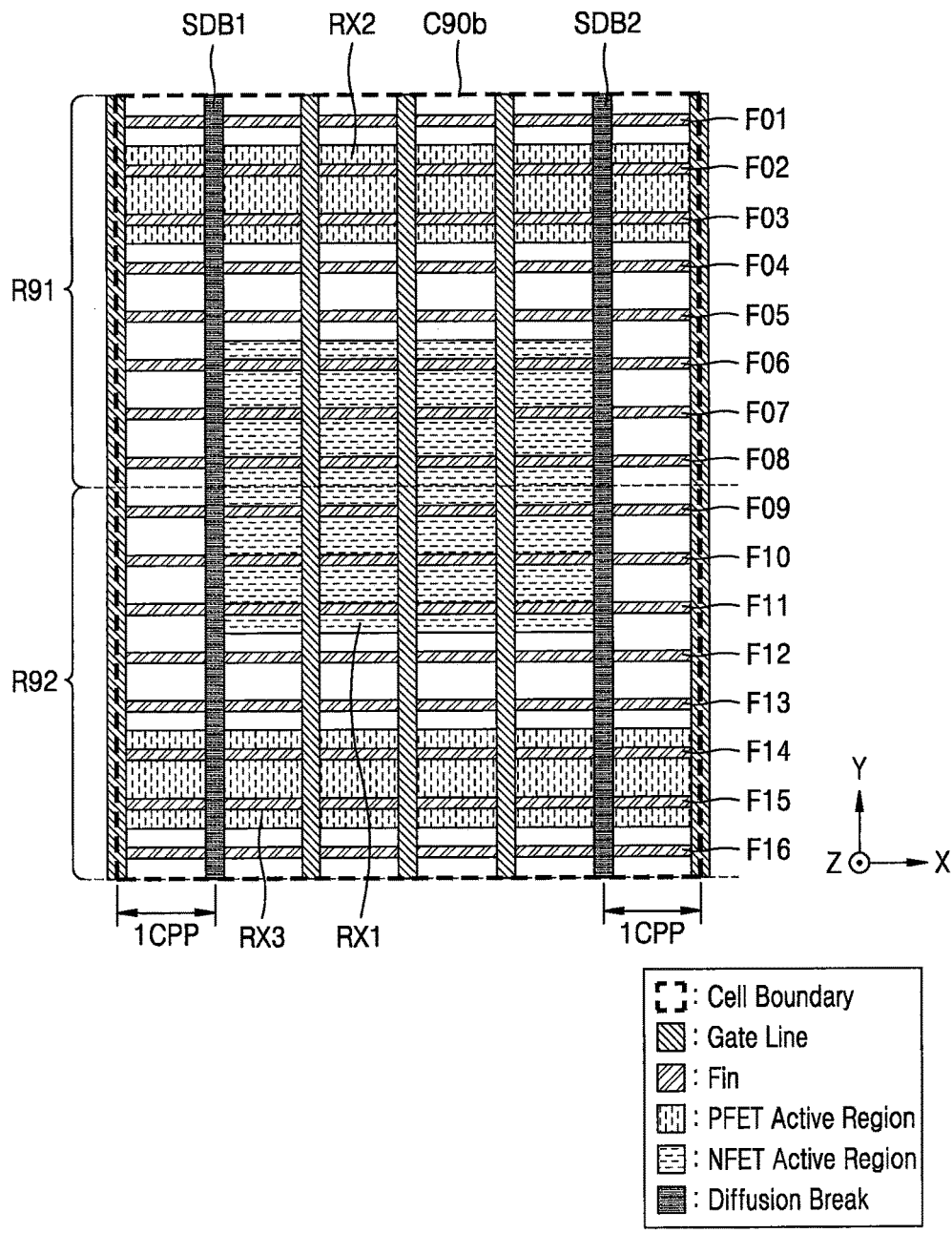

FIGS. 9A and 9B are plan views illustrating cells C90a and C90b according to some embodiments of the inventive concept. In detail, the cell C90a of FIG. 9A is a multiple height cell and may include active regions terminated by double diffusion breaks DDB1 and DDB2, and the cell C90b of FIG. 9B is a multiple height cell and may include active regions terminated by single diffusion breaks SDB1 and SDB2. Hereinafter, description of elements of features associated with embodiments of FIGS. 9A and 9B that has already provided above will be omitted in the interest of brevity.

Referring to FIG. 9A, the cell C90a may be placed in or may span a first row R91 and a second row R92, and may include first through third active regions RX1, RX2, and RX3 extending in an X-axis direction and gate lines extending in a Y-axis direction. The first through third active regions RX1, RX2, and RX3 extending in an X-axis direction may be terminated by the double diffusion breaks DDB1 and DDB2. The first active region RX1 may pass through a boundary between the first row R91 and the second row R92 to extend in a Y-axis direction. That is, the first active region RX1 included in the cell C90a may correspond to an active region to which the first active region RX1 and the third active region RX3 included in the second cell C02 of FIG. 1 are at least partially connected, i.e., portions thereof are connected to each other, or an active region in which the first active region RX1 and the third active region RX3 are merged. Thus, a length of an active region for an NFET of the cell C90a (that is, the first active region RX1) in an Y-axis direction may be greater than a sum of lengths of active regions for an NFET of the second cell C02 of FIG. 1 (that is, the first and third active regions RX1 and RX3) in an Y-axis direction.

The cell C90a may include a plurality of fins F01 through F16 extending in an X-axis direction. At least some of the plurality of fins F10 through F16 (for example, a fin F02) may form a transistor with gate lines, and at least some other fins (for example, a fin F04) may be a dummy fin. A size or a current driving strength of a transistor may be determined based on a number of fins crossing the gate line. As described above, the cell C90a may include an active region having an extended length in a Y-axis direction for an NFET (that is, the first active region RX1), and thus, a number of fins overlapping the active region for an NFET may be greater than a number of fins overlapping the active regions for a PFET (the second and third active regions RX2 and RX3). For example, as illustrated in FIG. 9A, six fins, the fins F06 through F11, may overlap the first active region RX1, and four fins, the fins F02, F03, F14, and F15, may overlap the second active region RX2 (fins F02 and F03) or the third active region RX3 (fins F014 and F15). Accordingly, the cell C90a may have a relatively boosted NFET, and as will be described below with reference to FIG. 10, serially connected transistors on the circuit diagram may be formed in the first active region RX1. While FIG. 9A illustrates an example where an active region for an NFET (that is, the first active region RX1) has an extended length in a Y-axis direction, it will be understood that an active region for a PFET may also have an extended length in a Y-axis direction in other embodiments of the inventive concept.

Referring to FIG. 9B, the cell C90b may be placed in or may span the first row R91 and the second row R92, and may include first through third active regions RX1, RX2, and RX3 extending in an X-axis direction, and the first active region RX1 may pass through a boundary between the first row R91 and the second row R92 to extend in a Y-axis direction. In addition, the cell C90b may include gate lines extending in a Y-axis direction and a plurality of fins F01 through F16 extending in an X-axis direction. Compared to the cell C90a of FIG. 9A, the first through third active regions RX1, RX2, and RX3 extending in an X-axis direction may be terminated by single diffusion breaks SDB1 and SDB2.

The first active region RX1 may be spaced apart from a boundary of the cell C90b based on a design rule that may be defined according to a semiconductor process. A cell that is adjacent to the cell C90b in an X-axis direction in an integrated circuit may include active regions for an NFET, which are merged or combined at the boundary between the first row R91 and the second row R92 like the cells of FIG. 1, and space needed to form active regions of different structures in a semiconductor process as described above may be defined based on a design rule. For example, as illustrated in FIG. 9B, the first active region RX1 may be spaced apart from boundaries of the cell C90b that face each other in an X-axis direction, by about 1 CPP.

Figure 10:
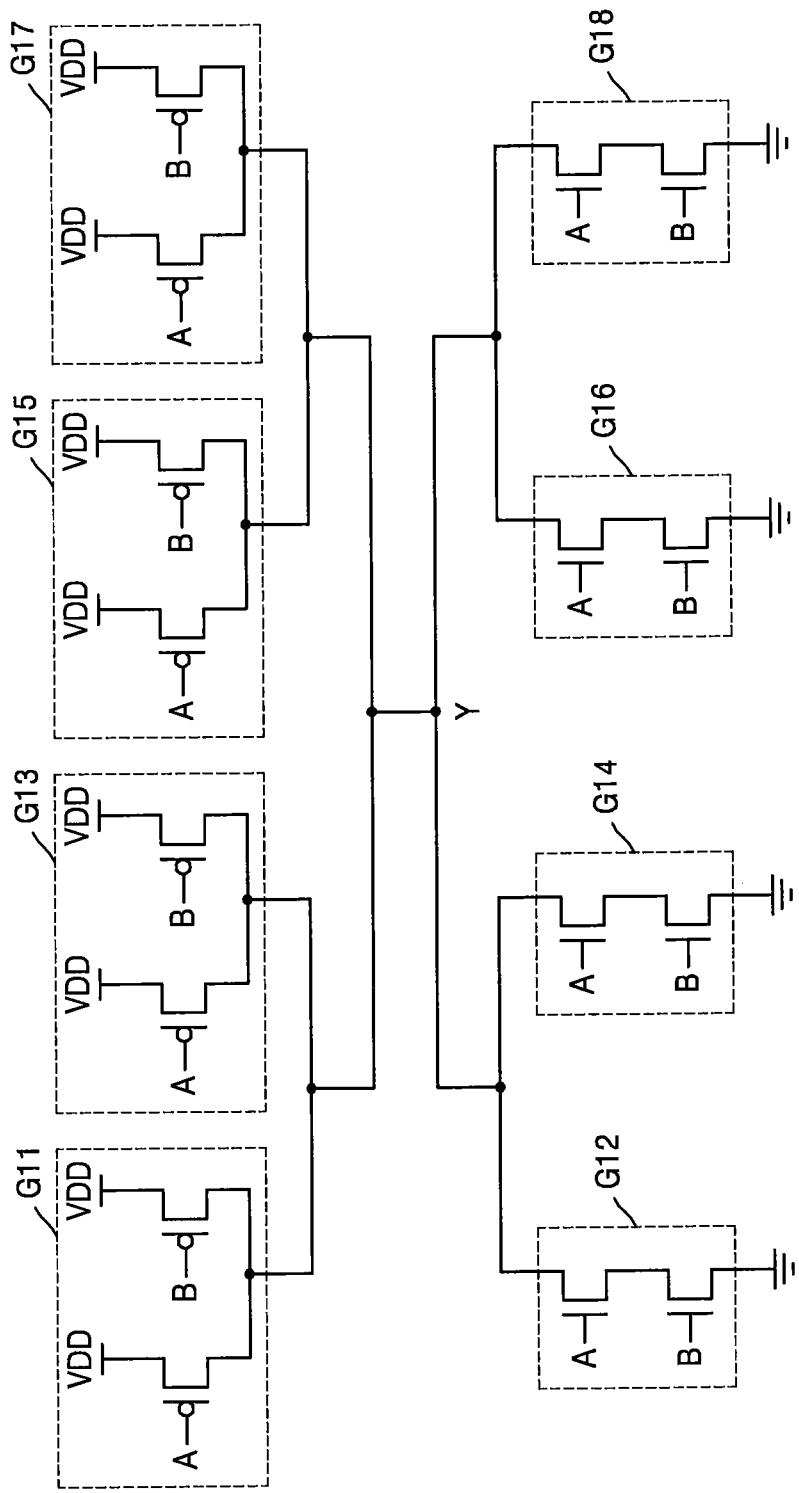
FIG. 10 is a circuit diagram of a cell according to some embodiments of the inventive concept.
Figure 11:
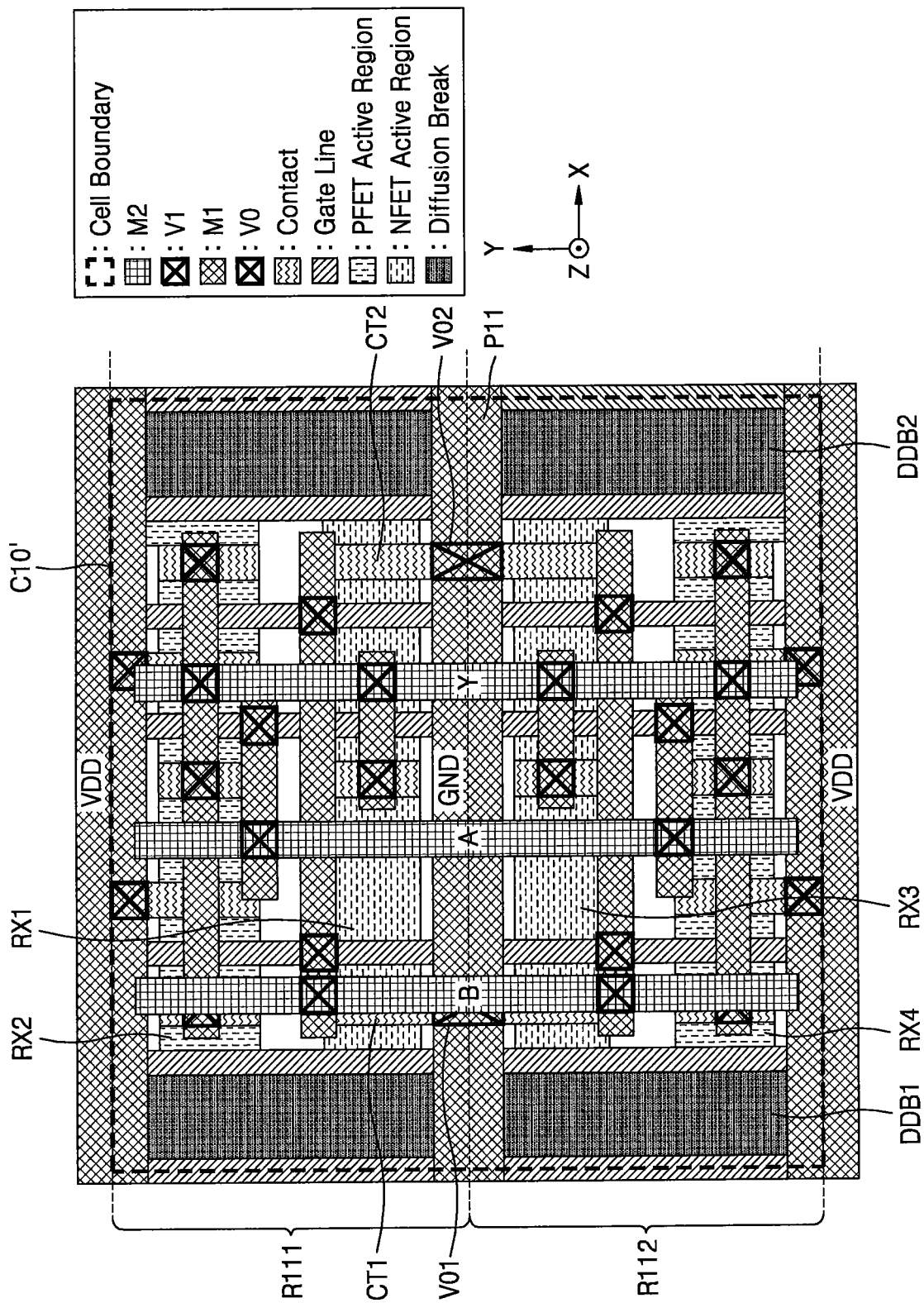
FIG. 11 is a plan view illustrating an example of a layout of a cell corresponding to the circuit diagram of FIG. 10, according to some embodiments of the inventive concept.

FIG. 10 is a circuit diagram of a cell according to some embodiments of the inventive concept, and FIG. 11 is a plan view illustrating an example of a layout of a cell corresponding to the circuit diagram of FIG. 10, according to some embodiments of the inventive concept. In detail, FIGS. 10 and 11 illustrate NAND cells C10 and C10' functioning as 2-input NAND gates having input signals A and B and an output signal Y.

Referring to FIG. 10, the NAND cell C10 may include a plurality of transistor groups G11 through G18 as high driving strength cells. A transistor group and another transistor group may be connected in parallel with each other, and may commonly receive an input signal. For example, the transistor groups G11, G13, G15, and G17 including a PFET may be connected in parallel with each other between an output node, that is, a node corresponding to the output signal Y, and a positive supply voltage VDD, and may commonly receive input signals A and B. In addition, the transistor groups G12, G14, G16, and G18 including an NFET may be connected in parallel with each other between an output node and a ground voltage GND, and may commonly receive input signals A and B.

Referring to FIG. 11, the NAND cell C10' is a double height cell and may be placed in or may span a first row R111 and a second row R112, and may include first through fourth active regions RX1, RX2, RX3, and RX4 that are terminated by double diffusion breaks DDB1 and DDB2. A power line P11, to which a ground voltage GND is applied at a boundary between the first row R111 and the second row R112, may extend in an X-axis direction, and the first and third active regions RX1 and RX3 may be disposed adjacent to the power line P11. To receive a ground voltage GND through the power line P11, as illustrated in FIG. 11, the NAND cell C10' may include contacts CT1 and CT2 that are connected to the first and third active regions RX1 and RX3 and extend by passing through the boundary between the first row R111 and the second row R112. In addition, the NAND cell C10' may include vias V01 and V02 connected to the power line P11 and placed on the boundary between the first row R111 and the second row R112, and in some embodiments, the vias V01 and V02 may be bar-type vias extending in a Y-axis direction as illustrated in FIG. 11. As an area of the vias V01 and V02 increases, IR drop (or voltage drop) occurring on a current path from the power line P11 to elements of the NAND cell C10', that is, for example, transistors, may be reduced.

Figure 12:
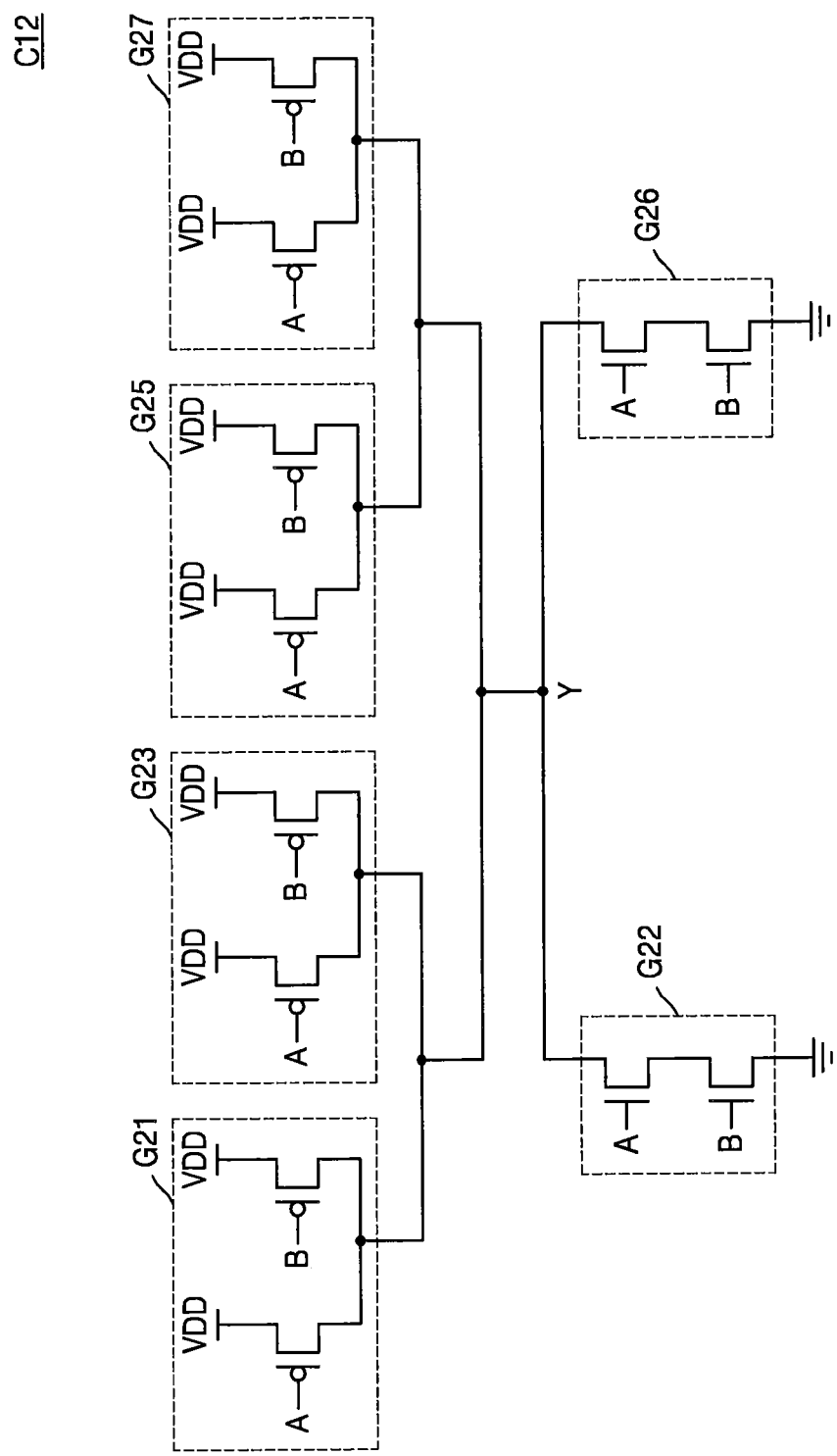
FIG. 12 is a circuit diagram of a cell according to some embodiments of the inventive concept.
Figure 13:
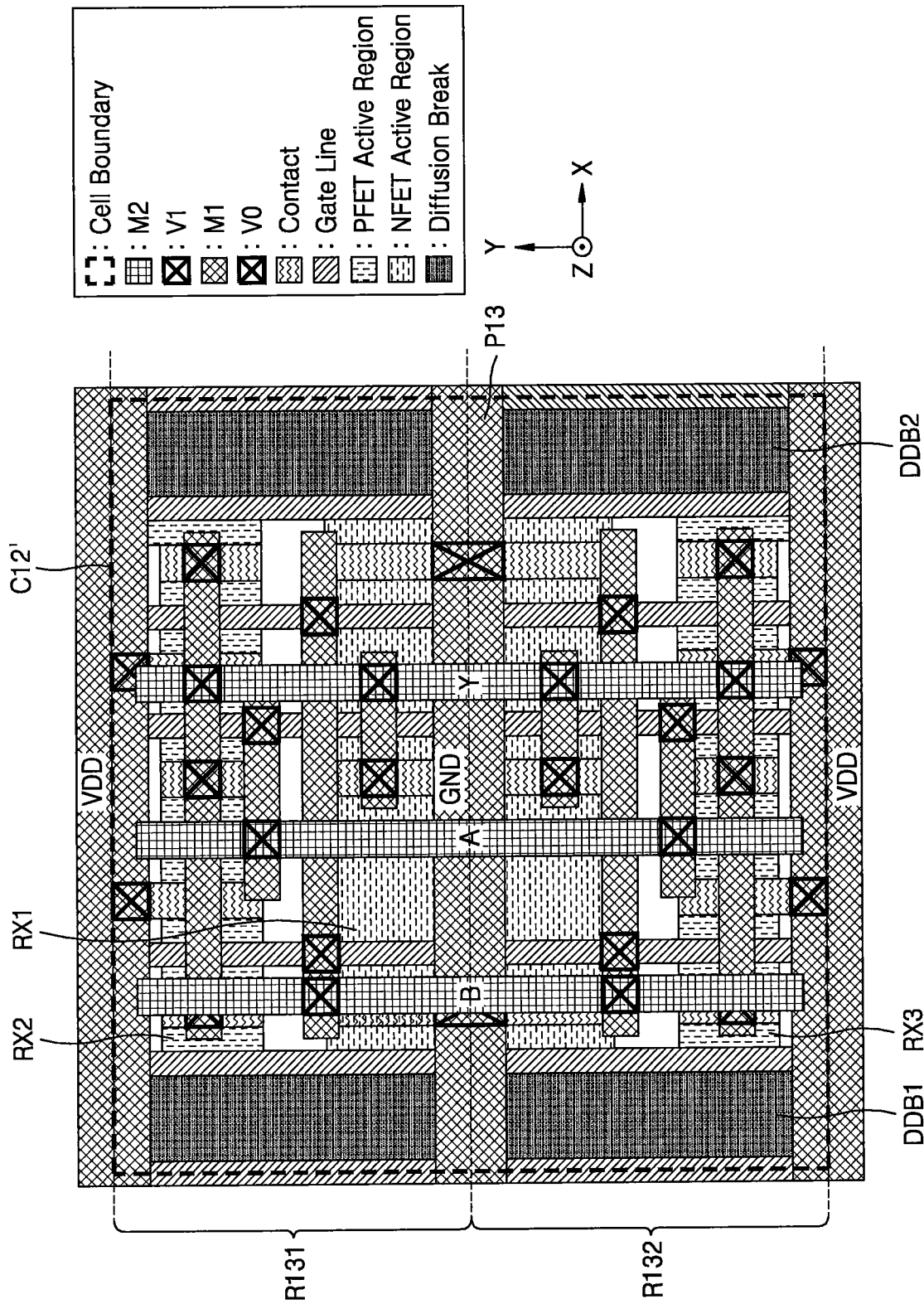
FIG. 13 is a plan view illustrating an example of a layout of a cell corresponding to the circuit diagram of FIG. 12, according to some embodiments of the inventive concept.

FIG. 12 is a circuit diagram of a cell according to some embodiments of the inventive concept, and FIG. 13 is a plan view illustrating an example of a layout of a cell corresponding to the circuit diagram of FIG. 12, according to some embodiments of the inventive concept. In detail, similar to FIGS. 10 and 11, FIGS. 12 and 13 illustrate NAND cells C12 and C12' functioning as a 2-input NAND gate having input signals A and B and an output signal Y. Hereinafter, description of elements or features provided above with reference to FIGS. 10 and 11 will be omitted in the description of the embodiments of FIGS. 12 and 13.

Referring to FIG. 12, the NAND cell C12 may include a plurality of transistor groups G21 through G26. Compared to the NAND cell C10 of FIG. 10, the NAND cell C12 of FIG. 12 may include transistor groups G22 and G26 having a relatively large NFET, that is, an NFET having a high current driving strength. Accordingly, NFETs of the NAND cell C12 may be boosted, and an operating speed of the NAND cell C12 may be increased.

Referring to FIG. 13, the NAND cell C12' is a double height cell and may be placed in or may span a first row R131 and a second row R132, and may include first through third active regions RX1, RX2, and RX3 that are terminated by double diffusion breaks DDB1 and DDB2. A power line P13 to which a ground voltage GND is applied at boundary between the first row R131 and the second row R132 may extend in an X-axis direction, and similar to the description provided above with reference to FIGS. 9A and 9B, the first active region RX1 as an active region for an NFET may extend in a Y-axis direction across the boundary between the first row R131 and the second row R132. Accordingly, transistors formed via the first active region RX1 and gate lines, that is, NFETs, may have a relatively high current driving strength compared to the NFETs included in the NAND cell C10' of FIG. 11, and may be boosted as described above with reference to FIG. 12. As described above, transistors to be boosted, from among the transistors included in a cell, for example, transistors that are serially connected and a transistor group including these transistors, may be formed in an active region having an extended length in a Y-axis direction (or a merged active region).

FIGS. 14A and 14B are plan views illustrating inverter cells C14a and C14b according to some embodiments of the inventive concept. In detail, FIGS. 14A and 14B illustrate layouts of the inverter cells C14a and C14b, which are double height cells placed in or spanning a first row R141 and a second row R142 and correspond to an identical circuit. Hereinafter, description of elements and features provided above and included in the description of embodiments with reference to FIGS. 14A and 14B will be omitted in the interest of brevity.

In some embodiments, a cell may include active regions that are terminated by a single diffusion break or a double diffusion break according to a conductivity type of the active regions. An element, for example, a transistor, may have characteristics that vary based on a distance between the element and a diffusion break, and may also have different characteristics according to a type of the diffusion break as described above with reference to FIG. 3. For example, a PFET adjacent to a single diffusion break may provide better characteristics, for example, a higher current, than a PFET adjacent to a double diffusion break. In addition, an NFET adjacent to a double diffusion break may provide better characteristics, for example, a higher current, than an NFET adjacent to a single diffusion break. Accordingly, as illustrated in FIGS. 14A and 14B, the inverter cells C14a and C14b may include active regions for an NFET, terminated by a double diffusion break and active regions for a PFET, terminated by a single diffusion break. As described above, a structure where diffusion breaks of different structures are used may be referred to as a mixed diffusion break (MDB). As described above with reference to the drawings, the inverter cells C14a and C14b as double height cells may include more transistors that are adjacent to a mixed diffusion break, than a single height cell, and, thus, may provide relatively high or improved performance.

Referring to FIG. 14A, the inverter cell C14a may include active regions for an NFET, which are disposed at an inner region, that is, first and third active regions RX1 and RX3, and active regions for a PFET, which are disposed at an outer region, that is, second and fourth active regions RX2 and RX4. In addition, the inverter cell C14a may include active regions terminated by a mixed diffusion break. For example, the first and third active regions RX1 and RX3 which are active regions for an NFET may be terminated by double diffusion breaks DDB1 and DDB2, whereas the second and fourth active regions RX2 and RX4 which are active regions for a PFET may be respectively terminated by two single diffusion breaks from among single diffusion breaks SDB1 through SDB4. In addition, like the first active region RX1 included in the NAND cell C12' of FIG. 13, it will be understood that a merged active region may also be terminated by a single diffusion break or a double diffusion break according to a conductivity type of the active region.

Referring to FIG. 14B, the inverter cell C14b may include active regions for a PFET, which are disposed at an inner region, that is, first and third active regions RX1 and RX3, and active regions for an NFET, which are disposed at an outer region, that is, second and fourth active regions RX2 and RX4. In addition, the inverter cell C14b may include active regions terminated by a mixed diffusion break. For example, the first and third active regions RX1 and RX3, which are active regions, for a PFET may be terminated by single diffusion breaks DDB1 and DDB2, whereas the second and fourth active regions RX2 and RX4, which are active regions for an NFET, may be respectively terminated by two double diffusion breaks from among double diffusion breaks DDB1 through DDB4.

Figure 15A:
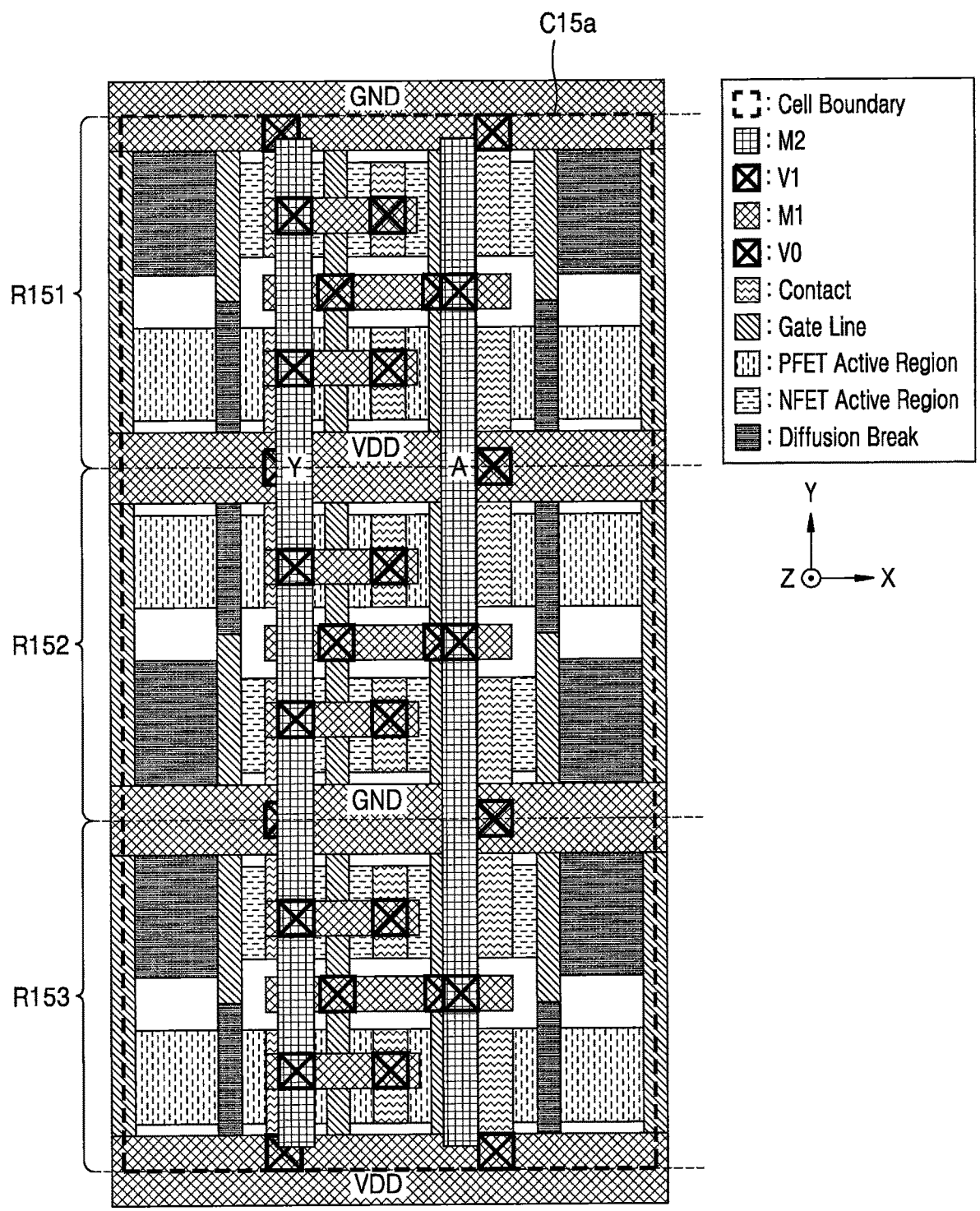
FIGS. 15A and 15B are plan views illustrating inverter cells according to some embodiments of the inventive concept.
Figure 15B:
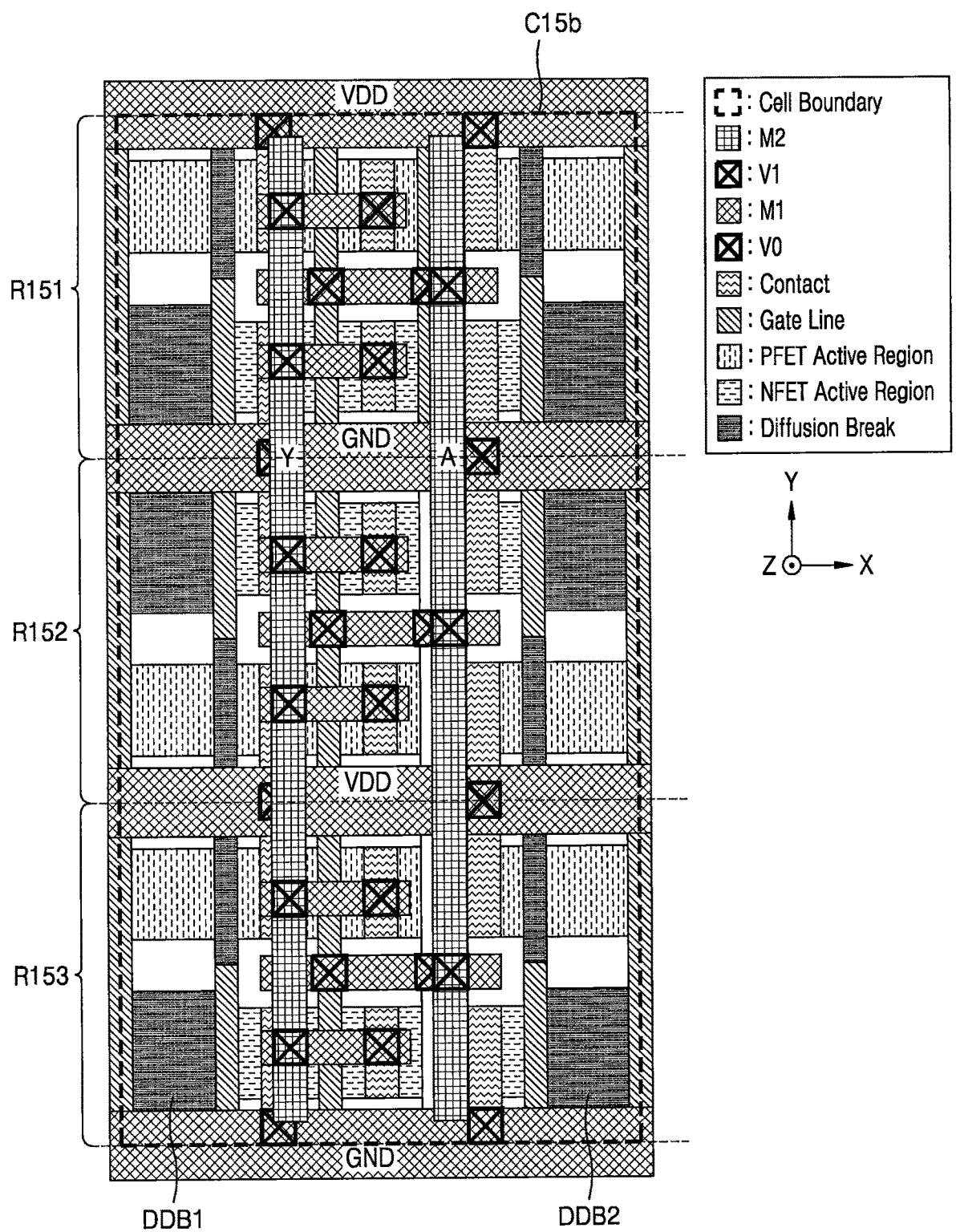

FIGS. 15A and 15B are plan views illustrating inverter cells C15a and C15b according to some embodiments of the inventive concept. In detail, FIGS. 15A and 15B illustrate layouts of the inverter cells C15a and C15b, which are multiple height cells continuously placed in or spanning a first row R151, a second row R152, and a third row R153 and correspond to an identical circuit. Hereinafter, description of elements and features provided above with reference to the embodiments of FIGS. 14A and 14B will be omitted in the description of the embodiments of FIGS. 15A and 15B in the interest of brevity.

Referring to FIG. 15A, the inverter cell C15a may include active regions terminated by a mixed diffusion break. For example, the inverter cell C15a may sequentially include, in a −(minus) Y direction (that is, a downward direction in FIG. 15A), an active region for an NFET, a pair of active regions for a PFET, a pair of active regions for an NFET, and an active region for a PFET. Accordingly, a double diffusion break, a single diffusion break, a double diffusion break, and a single diffusion break may be sequentially disposed in a −Y direction.

Referring to FIG. 15B, the inverter cell C15b may include active regions terminated by a mixed diffusion break. For example, the inverter cell C15b may sequentially include, in a −Y direction, an active region for a PFET, a pair of active regions for an NFET, a pair of active regions for a PFET, and an active region for an NFET. Accordingly, a single diffusion break, a double diffusion break, a single diffusion break, and a double diffusion break may be sequentially disposed in a −Y direction.

FIG. 16 is a schematic plan view illustrating an integrated circuit 16 according to some embodiments of the inventive concept. In detail, FIG. 16 illustrates the integrated circuit 16 including first through third cells C21, C22, and C23 placed in or spanning first through fifth rows R01 through R05.

In some embodiments, the integrated circuit 16 may include a plurality of cells corresponding to an identical circuit, that is, cells having a similar or an identical function but different heights. For example, the first cell C21, the second cell C22, and the third cell C23 of FIG. 16 may include a same number of NFETs and a same number of PFETs, and may correspond to a similar or an identical circuit. The first cell C21 may include a diffusion break having a smallest area compared to the second cell C22 and the third cell C23, and thus, the first cell C21 may have a smaller area than the second cell C22 and the third cell C23. In addition, the third cell C23 may include a largest number of transistors that are adjacent to a diffusion break, compared to the first cell C21 and the second cell C22, and thus, the third cell C23 may provide relatively higher or improved performance compared to the first cell C21 and the second cell C22. In addition, the second cell C22 may have an area and a functional performance of a medium level as compared to the first cell C21 and the third cell C23. Accordingly, the integrated circuit 16 may include cells providing a similar or an identical function that are appropriately placed based on requirements, such as an area, performance, or the like, and as a result, efficiency, performance, and/or operational reliability of the integrated circuit 16 may be improved.

Figure 17:
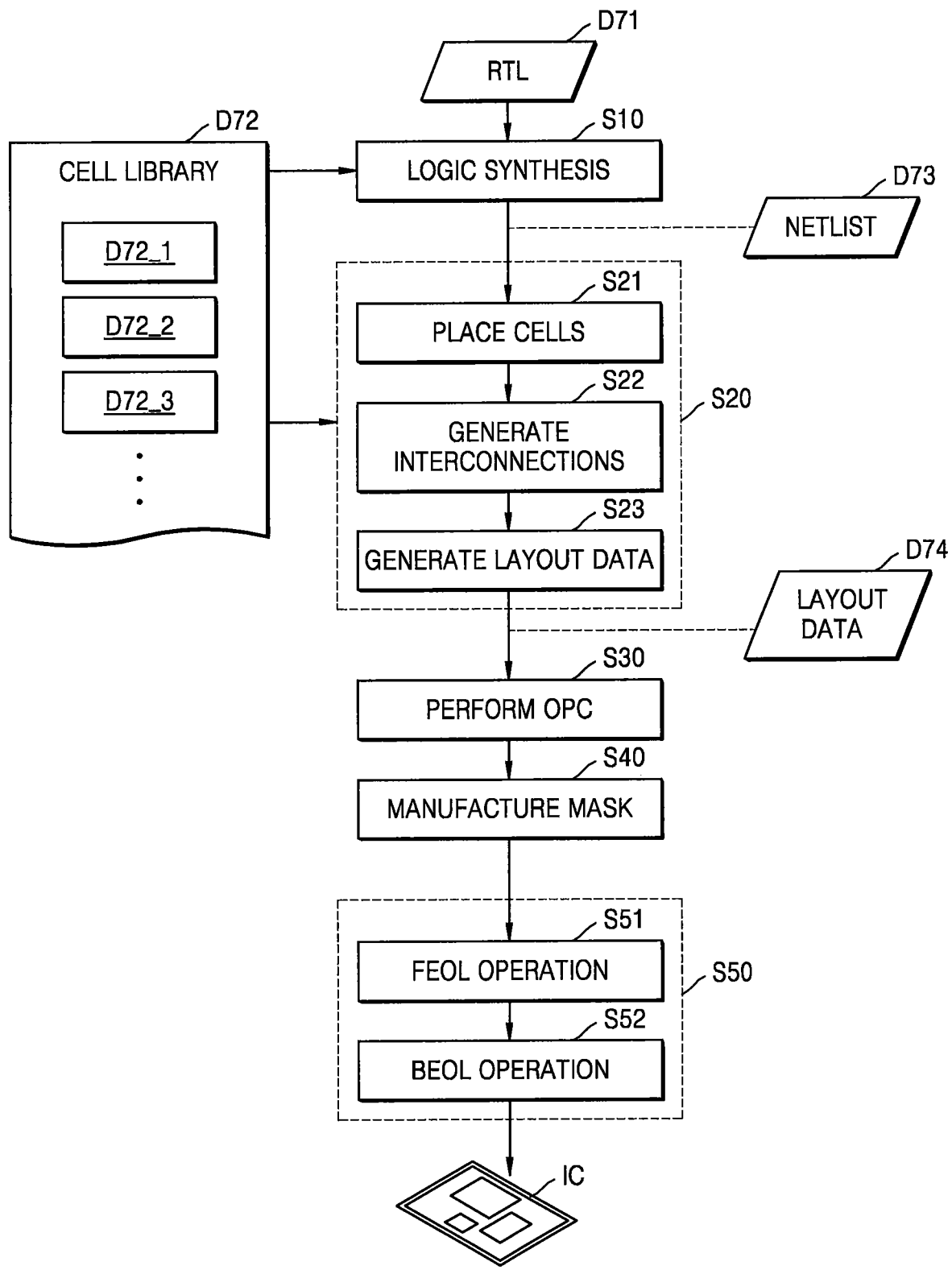
FIG. 17 is a flowchart of a method of manufacturing an integrated circuit device according to some embodiments of the inventive concept.

FIG. 17 is a flowchart of a method of manufacturing an integrated circuit IC according to some embodiments of the inventive concept.

A cell library (or a standard cell library) D72 may include information about cells, for example, functionality information, element or device characteristics information, layout information or the like. As illustrated in FIG. 17, the cell library D72 may include data (for example, first through third data D72_1, D72_2, D72_3 or the like) defining a layout of a multiple height cell. In some embodiments, regarding cells providing a similar or an identical function, the first data D72_1 may define single height cells like the inverter cells C40a and C40b of FIGS. 4A and 4B, and the second data D72_2 may define double height cells like the inverter cells C60a and C60b of FIGS. 6A and 6B, and the third data D72_3 may define multiple height cells continuously placed in or spanning three rows like the inverter cells C80a and C80b of FIGS. 8A and 8B.

In operation S10, a logic synthesis operation of generating netlist data D73 from RTL data D71 may be performed. For example, a semiconductor design tool (for example, a logic synthesis tool) may perform logic synthesis by referring to the cell library D72 from the RTL data D71 written in Hardware Description Language (HDL) such as VHSIC Hardware Description Language (VHDL) and Verilog, thereby generating the netlist data D73 including a bitstream or a netlist. The cell library D72 may include information about the relatively high performance capabilities of multiple height cells, and the multiple height cells may be included in an integrated circuit IC by referring to that information in a logic synthesis process.

In operation S20, a place & routing (P&R) operation of generating layout data D74 from the netlist data D73 may be performed. As illustrated in FIG. 17, the P&R operation (S20) may include a plurality of operations (operations S21, S22, and S23).

In operation S21, an operation of placing cells may be performed. For example, a semiconductor design tool (for example, P&R tool) may be used to place a plurality of cells by referring to the cell library D72 from the netlist data D73. As described above, single height cells and multiple height cells may be placed by using the semiconductor tool.

In operation S22, an operation of generating interconnections may be performed. An interconnection may electrically connect an output pin and an input pin, and may include, for example, at least one via and at least one conductive pattern. As described above with reference to FIG. 6A, the above-described multiple height cells may have an input pin and/or an output pin providing candidate via points, thus facilitating routing and reducing or preventing routing congestion. In addition, interconnections may have a relatively simple structure, and signal delay occurring in the interconnections may be reduced.

In operation S23, an operation of generating the layout data D74 may be performed. The layout data D74 may have a format, such as GSDII, and may include geometrical information of cells and interconnections.

In operation S30, Optical Proximity Correction (OPC) may be performed. OPC may refer to an operation of forming a desired pattern by correcting distortions, such as refraction caused due to characteristics of light in photolithography included in a semiconductor process for the manufacture of an integrated circuit IC, and as OPC is applied to the layout data D74, a pattern on a mask may be determined. In some embodiments, a layout of the integrated circuit IC may be limitedly modified in operation S30, and this limited deformation of the integrated circuit IC in operation S30 may be a post-process performed to improve or optimize a structure of the integrated circuit IC and may be referred to as design polishing.

In operation S40, an operation of manufacturing a mask may be performed. For example, as OPC is applied to the layout data D74, patterns on a mask may be defined to form patterns formed in a plurality of layers, and at least one mask (or a photomask) to be used to form respective patterns of a plurality of layers may be manufactured.

In operation S50, an operation of fabricating the integrated circuit IC may be performed. For example, the integrated circuit IC may be fabricated by patterning the plurality of layers by using the at least one mask manufactured in operation S40. As illustrated in FIG. 17, operation S50 may include operations S51 and S52.

In operation S51, a front-end-of-line (FEOL) operation may be performed. FEOL may refer to an operation of forming individual elements, such as a transistor, a capacitor, a resistor or the like, on a substrate, in a fabricating process of the integrated circuit IC. For example, FEOL may include, but is not limited to, an operation of planarizing and cleaning a wafer, an operation of forming a trench, an operation of forming a well, an operation of forming a gate line, an operation of forming a source and a drain or the like.

In operation S52, a back-end-of-line (BEOL) operation may be performed. BEOL may refer to an operation of interconnecting individual elements, such as a transistor, a capacitor, a resistor or the like, in a fabricating process of the integrated circuit IC. For example, BEOL may include, but is not limited to, an operation of silicidating gate, source, and drain regions, an operation of adding a dielectric, a planarization operation, an operation of forming a hole, an operation of adding a metal layer, an operation of forming a via, an operation of forming a passivation layer or the like. Next, the integrated circuit IC may be packaged in a semiconductor package, and may be used as a component of various applications.

Figure 18:
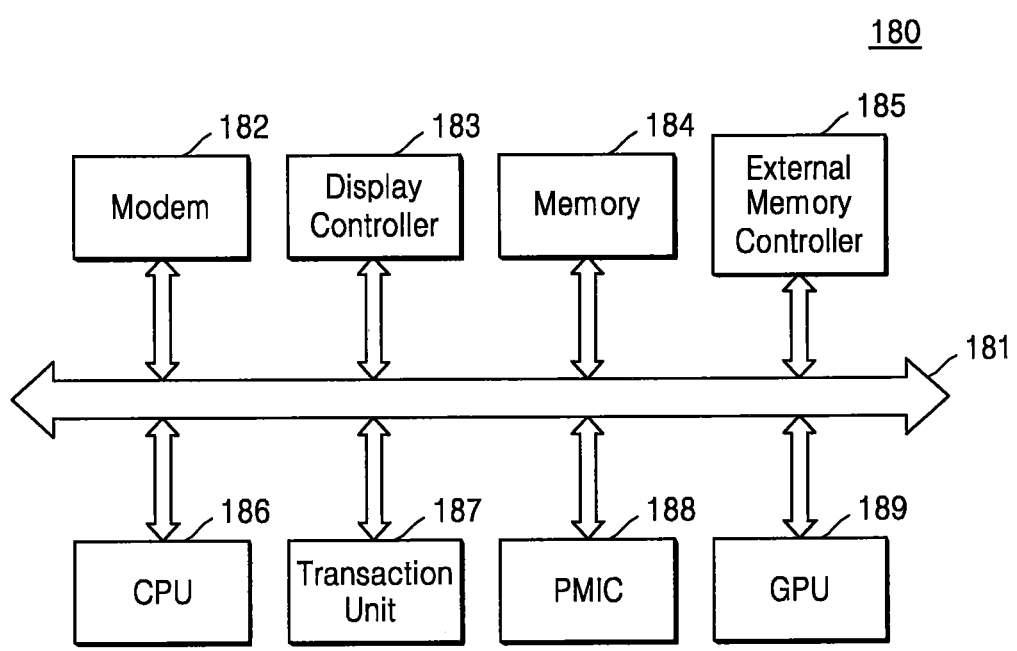
FIG. 18 is a block diagram illustrating a system on chip (SoC) according to some embodiments of the inventive concept.

FIG. 18 is a block diagram illustrating a system on chip (SoC) 180 according to some embodiments of the inventive concept. The SoC 180 may include an integrated circuit according to some embodiments of the inventive concept as a semiconductor device. The SoC 180 may be a chip on which complex functional blocks, such as intellectual property (IP), performing various functions are implemented, and the multiple height cells according to the embodiments of the inventive concept may be included in one or more of the functional blocks of the SoC 180, and thus the SoC 180 may provide higher efficiency, improved performance, and/or improved operating reliability.

Referring to FIG. 18, the SoC 180 may include a modem 182, a display controller 183, a memory 184, an external memory controller 185, a central processing unit (CPU) 186, a transaction unit 187, a power management integrated circuit (PMIC) 188, and a graphic processing unit (GPU) 189, and each functional block of the SoC 180 may communicate with each other via a system bus 181.

The CPU 186 that controls the overall operation of the SoC 180 may control operation of other functional blocks, such as, for example, the modem 182, the display controller 183, the memory 184, the external memory controller 185, the transaction unit 187, the PMIC 188, and the GPU 189. The modem 182 may demodulate a signal received from the outside of the SoC 180 and/or may modulate a signal generated within the SoC 180 and transmit the modulated signal to the outside. The external memory controller 185 may control operations of transmitting and/or receiving data to or from an external memory device connected to the SoC 180. For example, a program and/or data stored in an external memory device may be provided to the CPU 186 or the GPU 189 under the control of the external memory controller 185. The CPU 186 may execute program instructions associated with graphics processing. The GPU 189 may receive graphic data via the external memory controller 185, and/or may transmit graphic data processed using the GPU 189 out of the SoC 180 via the external memory controller 185. The transaction unit 187 may monitor data transactions of each functional block, and the PMIC 188 may control power supplied to each functional block under the control of the transaction unit 187. The display controller 183 may transmit data generated within the SoC 180 to a display (or a display device) outside the SoC 180 by controlling the display.

The memory 184 may be a non-volatile memory, such as, but not limited to, an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM) or the like, and as a volatile memory, a dynamic random access memory (DRAM), a static random access memory (SDRAM), a mobile DRAM, a double data rate synchronous dynamic random access memory (DDR SDRAM), a low power DDR (LPDDR), an SDRAM, a graphic DDR (GDDR) SDRAM, a rambus dynamic random access memory (RDRAM) or the like.

Figure 19:
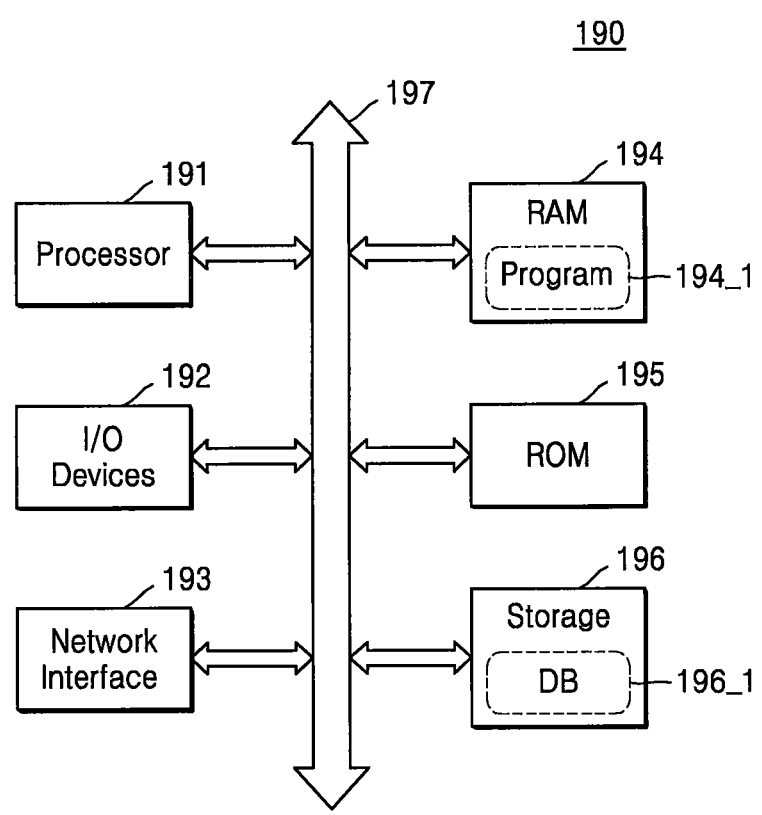
FIG. 19 is a block diagram illustrating a computing system including a memory configured to store a program, according to some embodiments of the inventive concept.

FIG. 19 is a block diagram illustrating a computing system 190 including a memory configured to store a program, according to some embodiments of the inventive concept. At least one of the operations included in the method of fabricating an integrated circuit according to some embodiments of the inventive concept (for example, the method of FIG. 17) may be performed on the computing system 190.

The computing system 190 may be a fixed-type computing system, such as a desktop computer, a work station, or a server, or may be a portable computing system, such as a laptop computer. As illustrated in FIG. 19, the computing system 190 may include a processor 191, input/output devices 192, a network interface 193, a random access memory (RAM) 194, a read only memory (ROM) 195, and a storage device 196. The processor 191, the input/output devices 192, the network interface 193, the RAM 194, the ROM 195, and the storage device 196 may be connected to a bus 197 and may communicate with each other via the bus 197.

The processor 191 may be referred to as a processing unit, and may include at least one core, such as a micro-processor, an application processor (AP), a digital signal processor (DSP), a graphic processing unit (GPU), wherein the at least one core may execute any instruction set (for example, Intel Architecture-32 (IA-32), 64 bit extension IA-32, x86-64, PowerPC, Sparc, MIPS, ARM, IA-64 or the like). For example, the processor 191 may access a memory, that is, the RAM 194 or the ROM 195, via the bus 197, and may execute instructions stored in the RAM 194 and/or the ROM 195.

The RAM 194 may store a program 194_1 for manufacturing an integrated circuit according to some embodiments of the inventive concept or a portion of the program 194_1, and the program 194_1 may cause the processor 191 to perform at least one of the operations included in the method of manufacturing an integrated circuit (for example, the method FIG. 17). That is, the program 194_1 may include a plurality of instructions executable by the processor 191, and the plurality of instructions included in the program 194_1 may cause the processor 191 to perform at least some of the operations included in the flowchart described above with reference to, for example, FIG. 17.

The storage device 196 may not lose stored data even when the power supply to the computing system 190 is interrupted. For example, the storage device 196 may include a nonvolatile memory device or a storage medium, such as a magnetic tape, an optical disk, a magnetic disk or the like. In addition, the storage device 196 may be attachable to or detachable from the computing system 190. The storage device 196 may store the program 194_1 according to some embodiments of the inventive concept, or the program 194_1 or at least a portion of the program 194_1 may be loaded to the RAM 194 from the storage device 196 before the program 194_1 is executed by the processor 191. Alternatively, the storage device 196 may store a file written in a program language, and the program 194_1 generated from a file by using a compiler or the like or at least a portion of the program 194_1 may be loaded to the RAM 194. In addition, as illustrated in FIG. 19, the storage device 196 may store a database 196_1, and the database 196_1 may include information used to design an integrated circuit, for example, the cell library D72 of FIG. 17.

The storage device 196 may store data to be processed by the processor 191 or data processed by the processor 191. That is, according to the program 194_1, the processor 191 may generate data by processing data stored in the storage device 196 or may store generated data in the storage device 196. For example, the storage device 196 may store the RTL data D71, the netlist data D73, and/or the layout data D74 of FIG. 17.

The input/output devices 192 may include an input device, such as a keyboard or a pointing device or an output device, such as a display device or a printer. For example, by using the input/output devices 192, a user may trigger execution of the program 194_1 via the processor 191, input the RTL data D71 and/or the netlist data D73 of FIG. 17, and/or determine the layout data D74 of FIG. 17.

The network interface 193 may provide access for the computing system 190 to an external network. For example, a network may include a plurality of computing systems and communication links, and the communication links may include wired links, optical links, wireless links or other types of links.

While the inventive concept has been particularly shown and described with reference to embodiments thereof, it will be understood that various changes in form and details may be made therein without departing from the spirit and scope of the following claims.

What is claimed is:

1. An integrated circuit comprising:
   at least one active region extending in a first row in a first direction, the at least one active region in the first row comprising a first active region extending in the first row in the first direction and a second active region extending in the first row in the first direction;
   at least one active region extending in a second row in the first direction, the at least one active region in the second row comprising a third active region extending in the second row in the first direction and a fourth active region extending in the second row in the first direction; and
   a multiple height cell comprising the at least one active region in the first row, the at least one active region in the second row, the first active region and the second active region extending in the first row in the first direction and respectively having a first conductivity type and a second conductivity type, the third active region and the fourth active region extending in the second row in the first direction and respectively having the first conductivity type and the second conductivity type, and at least one gate line extending in a second direction crossing the first direction,
   wherein the first active region and the third active region are adjacent to each other, and
   wherein each of the at least one active region in the first row and the at least one active region in the second row is terminated by a diffusion break.

2. The integrated circuit of claim 1, wherein the diffusion break comprises a single diffusion break and a double diffusion break;
   wherein the first active region and the third active region are each terminated by the double diffusion break, and the second active region and the fourth active region are each terminated by the single diffusion break.

3. The integrated circuit of claim 1, wherein the diffusion break comprises a single diffusion break and a double diffusion break;
   wherein the first active region and the third active region are each terminated by the single diffusion break, and the second active region and the fourth active region are each terminated by the double diffusion break.

4. The integrated circuit of claim 1, wherein the multiple height cell comprises a contact that is connected to the first active region and the third active region and extends in the second direction through a boundary between the first row and the second row.

5. The integrated circuit of claim 1, wherein the multiple height cell further comprises:
a power line extending in the first direction on a boundary between the first row and the second row; and
a via on the boundary between the first row and the second row and connected to the power line.

6. The integrated circuit of claim 1, wherein the multiple height cell comprises:
at least one first conductive pattern formed on a first conductive layer; and
a second conductive pattern formed on a second conductive layer on the first conductive layer, wherein the second conductive pattern is configured to route an input signal or an output signal,
wherein the second conductive pattern extends in the second direction through a boundary between the first row and the second row.

7. The integrated circuit of claim 1, wherein each of the at least one active region of the first row and the at least one active region of the second row is terminated by a single diffusion break or a double diffusion break based on a conductivity type of the active region.

8. The integrated circuit of claim 1, further comprising:
cells placed in at least one row of the first row and the second row; and
wherein the multiple height cell is spaced apart from adjacent ones of the cells in the first direction by 1 Contacted Poly Pitch (CPP) or more.

9. The integrated circuit of claim 1, wherein the multiple height cell comprises a plurality of transistor groups that are connected in parallel with each other and configured to commonly receive an input signal,
wherein each of at least two transistor groups from among the plurality of transistor groups includes transistors that share one gate line of the at least one gate line.

10. The integrated circuit of claim 1, further comprising:
a single height cell that corresponds to an identical circuit as the multiple height cell and comprises at least one active region terminated by a diffusion break.

11. The integrated circuit of claim 10, wherein the multiple height cell is configured to provide a higher operating speed than the single height cell.

12. The integrated circuit of claim 1, wherein respective partial portions of the first active region and the third active region are connected to each other.

13. The integrated circuit of claim 12, wherein the diffusion break comprises a double diffusion break; and
wherein the first active region and the third active region are terminated by the double diffusion break.

14. The integrated circuit of claim 12, wherein the multiple height cell comprises a plurality of fins extending in the first direction,
wherein a number of fins overlapping the first active region or the third active region is greater than a number of fins overlapping the second active region or the fourth active region in a plane view of the integrated circuit.

15. The integrated circuit of claim 14, wherein the multiple height cell comprises transistors that are connected in series to each other and formed in the first active region and the third active region.

16. An integrated circuit comprising:
a multiple height cell comprising a plurality of active regions in two or more rows and extending in a first direction,
wherein the multiple height cell comprises:
the plurality of active regions extending in the first direction and being terminated by a diffusion break;
at least one gate line extending in a second direction crossing the first direction; and
a plurality of transistor groups that are connected in parallel with each other and configured to commonly receive an input signal,
wherein each of at least two transistor groups from among the plurality of transistor groups includes transistors that share one gate line; and
a single height cell that corresponds to a circuit identical to the multiple height cell and comprises at least one active region terminated by the diffusion break.

17. The integrated circuit of claim 16, wherein the diffusion break comprises a single diffusion break and a double diffusion break; and
wherein each of the plurality of active regions is terminated by the single diffusion break or the double diffusion break based on a conductivity type of the active region.

18. The integrated circuit of claim 17, wherein an active region for an N-channel field effect transistor (NFET) from among the plurality of active regions is terminated by the double diffusion break, and
wherein an active region for a P-channel field effect transistor (PFET) from among the plurality of active regions is terminated by the single diffusion break.

19. An integrated circuit comprising:
a multiple height cell comprising a plurality of active regions in two or more rows and extending in a first direction,
wherein the multiple height cell comprises:
the plurality of active regions extending in the first direction; and
at least one gate line extending in a second direction crossing the first direction,
wherein each of the plurality of active regions is terminated by a diffusion break;
cells placed in at least one row of the two or more rows; and
wherein the multiple height cell is spaced apart from adjacent ones of the cells in the first direction by 1 Contacted Poly Pitch (CPP) or more.

20. The integrated circuit of claim 19, wherein the diffusion break comprises a single diffusion break and a double diffusion break; and
wherein each of the plurality of active regions is terminated by the single diffusion break or the double diffusion break based on a conductivity type of the active regions.

* * * * *